United States Patent
McPherson et al.

(10) Patent No.: US 10,405,450 B2
(45) Date of Patent: *Sep. 3, 2019

(54) HIGH POWER MULTILAYER MODULE HAVING LOW INDUCTANCE AND FAST SWITCHING FOR PARALLELING POWER DEVICES

(71) Applicant: Cree Fayetteville, Inc., Fayetteville, AR (US)

(72) Inventors: Brice McPherson, Fayetteville, AR (US); Alex Lostetter, Fayetteville, AR (US)

(73) Assignee: Cree Fayetteville, Inc., Fayetteville, AR (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/275,660

(22) Filed: Feb. 14, 2019

(65) Prior Publication Data

US 2019/0191585 A1    Jun. 20, 2019

Related U.S. Application Data

(63) Continuation of application No. 15/405,520, filed on Jan. 13, 2017, now Pat. No. 10,212,838.

(51) Int. Cl.
| | |
|---|---|
| *H05K 7/14* | (2006.01) |
| *H02M 7/00* | (2006.01) |
| *H05K 5/02* | (2006.01) |
| *H02M 3/158* | (2006.01) |
| *H02M 7/537* | (2006.01) |
| *H05K 5/00* | (2006.01) |

(52) U.S. Cl.
CPC .......... *H05K 7/1432* (2013.01); *H02M 3/158* (2013.01); *H02M 7/003* (2013.01); *H02M 7/537* (2013.01); *H05K 5/0069* (2013.01); *H05K 5/0247* (2013.01); *H01L 2224/48091* (2013.01); *H01L 2224/48247* (2013.01); *H01L 2224/48472* (2013.01)

(58) Field of Classification Search
USPC ...................................................... 361/736
See application file for complete search history.

(56) References Cited

U.S. PATENT DOCUMENTS

| | | |
|---|---|---|
| 10,020,237 B2 | 7/2018 | Hoehn et al. |
| 2009/0309524 A1 | 12/2009 | Rider et al. |
| 2013/0105961 A1 | 5/2013 | Jones et al. |
| 2014/0198475 A1 | 7/2014 | Menzies et al. |
| 2015/0070852 A1* | 3/2015 | Kawano ............ H05K 7/142 361/736 |
| 2015/0124409 A1* | 5/2015 | Kawano ............ H05K 5/0278 361/715 |
| 2015/0137871 A1 | 5/2015 | Takano |

* cited by examiner

*Primary Examiner* — Andargie M Aychillhum
(74) *Attorney, Agent, or Firm* — BakerHostetler

(57) ABSTRACT

The disclosure is directed to a power module that includes at least one power substrate, a housing arranged on the at least one power substrate, and a first terminal electrically connected to the at least one power substrate. The first terminal includes a contact surface located above the housing at a first elevation. The power module includes a second terminal including a contact surface located above the housing at a second elevation different from the first elevation, a third terminal electrically connected to the at least one power substrate, and a plurality of power devices electrically connected to the at least one power substrate.

24 Claims, 32 Drawing Sheets

HIGH POWER MULTILAYER MODULE HAVING LOW INDUCTANCE AND FAST SWITCHING FOR PARALLELING POWER DEVICES

CROSS REFERENCE TO PRIOR APPLICATIONS

This application is a continuation of U.S. patent application Ser. No. 15/405,520, filed Jan. 13, 2017, now U.S. Pat. No. 10,212,838 issued Feb. 19, 2019, which is incorporated herein by reference in its entirety.

BACKGROUND OF THE DISCLOSURE

1. Field of the Disclosure

This disclosure is directed to a high power multilayer module having low inductance and fast switching for paralleling power devices. Moreover, the disclosure is directed to a process of configuring a high power multilayer module having low inductance and fast switching for paralleling power devices.

2. Related Art

As will be appreciated by those skilled in the art, power modules are known in various forms. Power modules provide a physical containment for power components, usually power semiconductor devices. These power semiconductors are typically soldered or sintered on a power electronic substrate. The power module typically carries the power semiconductors, provides electrical and thermal contact, and includes electrical insulation.

Parasitic impedances in the power module, however, limit the practical implementation of these devices in current technologies. Specifically, the loop inductance during switching events can result in a voltage overshoot and ringing. This reduces stability, increases switching losses, creates Electromagnetic Interference (EMI), and stresses system components. Ultimately, these factors may limit the maximum switching frequency, which is desirable to reduce the size of external filters in a power conversion system.

Accordingly, what is needed is a power module configured to address parasitic impedances, such as loop inductance, to increase stability, decrease switching losses, reduce EMI, and/or limit stresses on system components.

SUMMARY OF THE DISCLOSURE

According to an aspect of the disclosure a power module includes at least one power substrate, a housing arranged on the at least one power substrate, a first terminal electrically connected to the at least one power substrate, the first terminal comprising a contact surface located above the housing at a first elevation, a second terminal comprising a contact surface located above the housing at a second elevation different from the first elevation, a third terminal electrically connected to the at least one power substrate, and a plurality of power devices electrically connected to the at least one power substrate.

According to an aspect of the disclosure a system that includes a power module includes at least one power substrate, a housing arranged on the at least one power substrate, a first terminal electrically connected to the at least one power substrate, the first terminal comprising a contact surface located above the housing, a second terminal comprising a contact surface located above the housing, a third terminal electrically connected to the at least one power substrate, a plurality of power devices electrically connected to the at least one power substrate, a first planar buss bar electrically connected to the first terminal, and a second planar buss bar electrically connected to the second terminal, where the first planar buss bar and the second planar buss bar are arranged one above the other.

According to an aspect of the disclosure a power module includes at least one power substrate, a housing arranged on the at least one power substrate, a first terminal electrically connected to the at least one power substrate, the first terminal comprising a contact surface located above the housing, a second terminal comprising a contact surface located above the housing, a third terminal electrically connected to the at least one power substrate, and a plurality of power devices electrically connected to the at least one power substrate, where current flows in a first direction from the first terminal across the at least one power substrate, and wherein the current flows in a second direction from the at least one power substrate to the second terminal to reduce impedance.

According to an aspect of the disclosure a process of configuring a power module includes providing at least one power substrate, providing a housing on the at least one power substrate, connecting a first terminal electrically to the at least one power substrate, providing the first terminal with a contact surface located above the housing at a first elevation, providing a second terminal comprising a contact surface located above the housing at a second elevation different from the first elevation, providing a third terminal electrically connected to the at least one power substrate, and providing a plurality of power devices electrically connected to the at least one power substrate.

Additional features, advantages, and aspects of the disclosure may be set forth or apparent from consideration of the following detailed description, drawings, and claims. Moreover, it is to be understood that both the foregoing summary of the disclosure and the following detailed description are exemplary and intended to provide further explanation without limiting the scope of the disclosure as claimed.

BRIEF DESCRIPTION OF THE DRAWINGS

The accompanying drawings, which are included to provide a further understanding of the disclosure, are incorporated in and constitute a part of this specification, illustrate aspects of the disclosure and together with the detailed description serve to explain the principles of the disclosure. No attempt is made to show structural details of the disclosure in more detail than may be necessary for a fundamental understanding of the disclosure and the various ways in which it may be practiced. In the drawings.

DETAILED DESCRIPTION OF THE DISCLOSURE

Figure 1A:
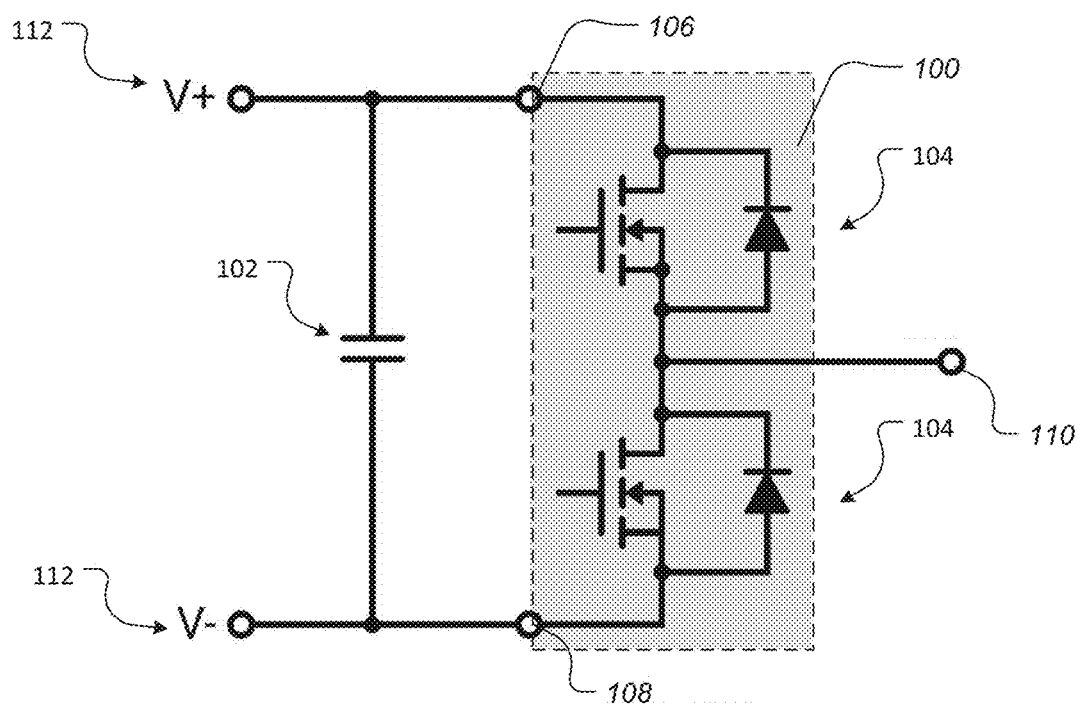
FIG. 1A schematically illustrates a half-bridge based topology of a power module according to aspects of the disclosure.

The aspects of the disclosure and the various features and advantageous details thereof are explained more fully with reference to the non-limiting aspects and examples that are described and/or illustrated in the accompanying drawings and detailed in the following description. It should be noted that the features illustrated in the drawings are not necessarily drawn to scale, and features of one aspect may be employed with other aspects as the skilled artisan would recognize, even if not explicitly stated herein. Descriptions of well-known components and processing techniques may be omitted so as to not unnecessarily obscure the aspects of the disclosure. The examples used herein are intended merely to facilitate an understanding of ways in which the disclosure may be practiced and to further enable those of skill in the art to practice the aspects of the disclosure. Accordingly, the examples and aspects herein should not be construed as limiting the scope of the disclosure, which is defined solely by the appended claims and applicable law. Moreover, it is noted that like reference numerals represent similar parts throughout the several views of the drawings.

This disclosure describes a power module that may include structure optimized for state-of-the-art wide band gap power semiconductor devices such as Gallium Nitride (GaN), Silicon Carbide (SiC), and the like, which are capable of carrying high amounts of currents and voltages and switching at increasingly faster speeds in comparison with established technologies. Conventional power electronic packages are limited in their functionality for these semiconductors, having internal layouts intended for silicon (Si) device technologies.

The disclosed power module may be configured to evenly distribute current between large arrays of paralleled devices with a significantly lower loop inductance than standard packaging approaches. A multi-level current path with terraced power terminals simplify an external connection with a bussing system, reducing inductance between the power module and filtering capacitors. The layout of the power module is highly configurable and may be configured to adopt most power circuit topologies common in the power electronics industry.

The disclosed power module makes significant improvements to the internal module performance, system level implementation, manufacturability, and ease of use through the addition of a tighter power loop and logical external terminal placement.

In this regard, the disclosed power module may be configured to provide at least one or more of the following:

Highly optimized low inductance power module structure.

Modular, scalable, and flexible layout and power flow.

Equalized paralleling of many power semiconductors to form a high current switch position.

Optimized gate and sense signal structure for paralleling of many power semiconductors.

Sense connectors for temperature sensing and over current protection.

Form factor suitable for high voltage operation up to about 1700V or more.

Scalable height to exceed 1700V operation.

Multi-layer internal conductor layout for optimized external system interconnection.

Modular internal structure designed to accommodate a variety of state-of-the-art materials, attaches, isolation and interconnection techniques.

Heavily optimized for high performance system level integration.

Easy to parallel, facilitating a direct scale up to higher currents.

Configurable in a wide variety of power topologies, including half-bridge, full-bridge, three phase, and like arrangements.

Scalable system implementation to meet a variety of power processing needs.

In essence, the disclosed power module configuration may allow for full utilization of the capabilities of advanced power semiconductors, providing significant improvements to power density, switching, efficiency, and the like.

The power devices of the power module range in structure and purpose. The term 'power device' refers to various forms of transistors and diodes designed for high voltages and currents. The transistors may be controllable switches allowing for unidirectional or bidirectional current flow (depending on device type) while the diodes may allow for current flow in one direction and may not controllable. The transistor types may include but are not limited to Metal Oxide Field Effect Transistor (MOSFET), a Junction Field Effect Transistor (JFET), Bipolar Junction Transistor (BJT), Insulated Gate Bipolar Transistor (IGBT), and the like.

The power devices may include Wide Band Gap (WBG) semiconductors, including Gallium Nitride (GaN), Silicon Carbide (SiC), and the like, and offer numerous advantages over conventional Silicon (Si) as a material for the power devices. Nevertheless, various aspects of the disclosure may utilize Si type power devices and achieve a number of the benefits described herein. The key metrics of the WBG semiconductors may include one or more of the following non-limiting aspects:

Higher voltage blocking.
Higher current density.
Higher temperature operation.
Faster switching.
Improved thermal performance.
Lower on-resistance (reduced conduction losses).
Lower turn-on and turn-off energies (reduced switching losses). It should be appreciated that these above-noted key metrics of the WBG semiconductors are not required and may not be the implemented in some aspects of the disclosure.

To effectively utilize the WBG semiconductor devices, a power module (also referred to as a power package) is employed. The power module may serve a number of functions including one or more of the following non-limiting aspects:

Provides electrical interconnection of power semiconductor devices into useful topologies.

Protects the sensitive devices from moisture, vibration, contamination, and the like Produces an effective and efficient means for the removal of waste heat generated from the devices as a result of conduction and switching losses.

Facilitates system level implementation with robust power and signal electrical connections to the internal layout. The power and signal electrical connections may be bolt-on, crimp-on, solder, plug and receptacle, and the like implementations.

Provides voltage safety with internal dielectric encapsulation and external voltage creepage and clearance distances according to industry adopted standards.

It should be appreciated that these above-noted functions are not required and may not be the implemented in some aspects of the disclosure.

FIG. 1A schematically illustrates a half-bridge based topology of a power module according to aspects of the disclosure. A half-bridge based topology is a fundamental building block in many switching power converters. For motor drives, inverters, and DC-DC converters, these topologies are typically connected to a DC supply 112, with a bank of DC link capacitors 102 as an intermediate connection between them. This is presented schematically in FIG. 1A. The DC link capacitors 102 may act to filter ripple on the line and counter the effects of inductance in the current path. Two half-bridges in parallel may form a full-bridge, while three in parallel may form a three phase topology. The three phase topology is also often referred to as a six pack, signifying the six switch positions among the three phase legs. Moreover, other topologies are contemplated for the power module including common source, common drain, and neutral point damp.

FIG. 1A further illustrates a power module 100 having one or more switch positions 104. The power module 100 may include a first terminal 106, a second terminal 108, and a third terminal 110.

Figure 1B:
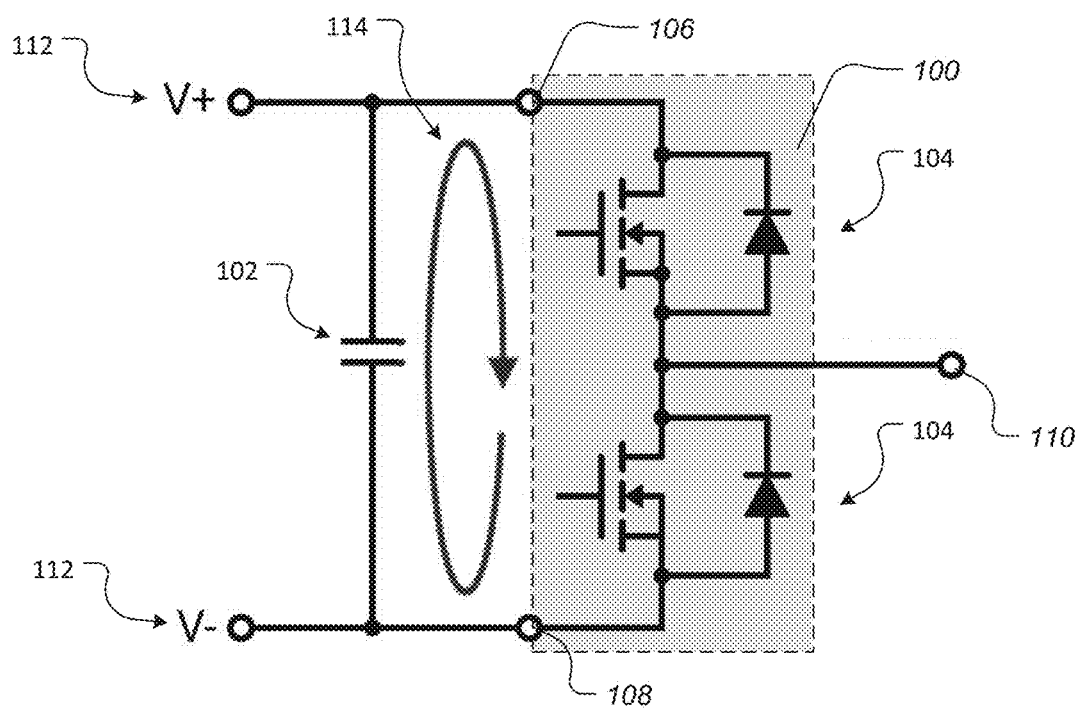
FIG. 1B illustrates a current loop between the DC link capacitors and switch positions inside of the power module of FIG. 1A.

FIG. 1B illustrates a current loop between the DC link capacitors and switch positions inside of the power module of FIG. 1A. The current loop 114 between the DC link capacitors 102 and the switch positions 104 inside of the power module 100 is crucially important in the system, having a significant influence in the switching performance of the semiconductors.

No system is perfect; for example, undesirable parasitic resistances, capacitances, and inductances are present in any electrical system. These impedances introduce detrimental effects on the performance and reliability unless they are reduced or mitigated. While a resistance and capacitance may be associated with each interconnection, the most influential for switching power devices may be the parasitic inductance. Higher inductances result in higher stored energy in the magnetic field, which causes voltage overshoots and ringing during switching transitions.

Figure 2:
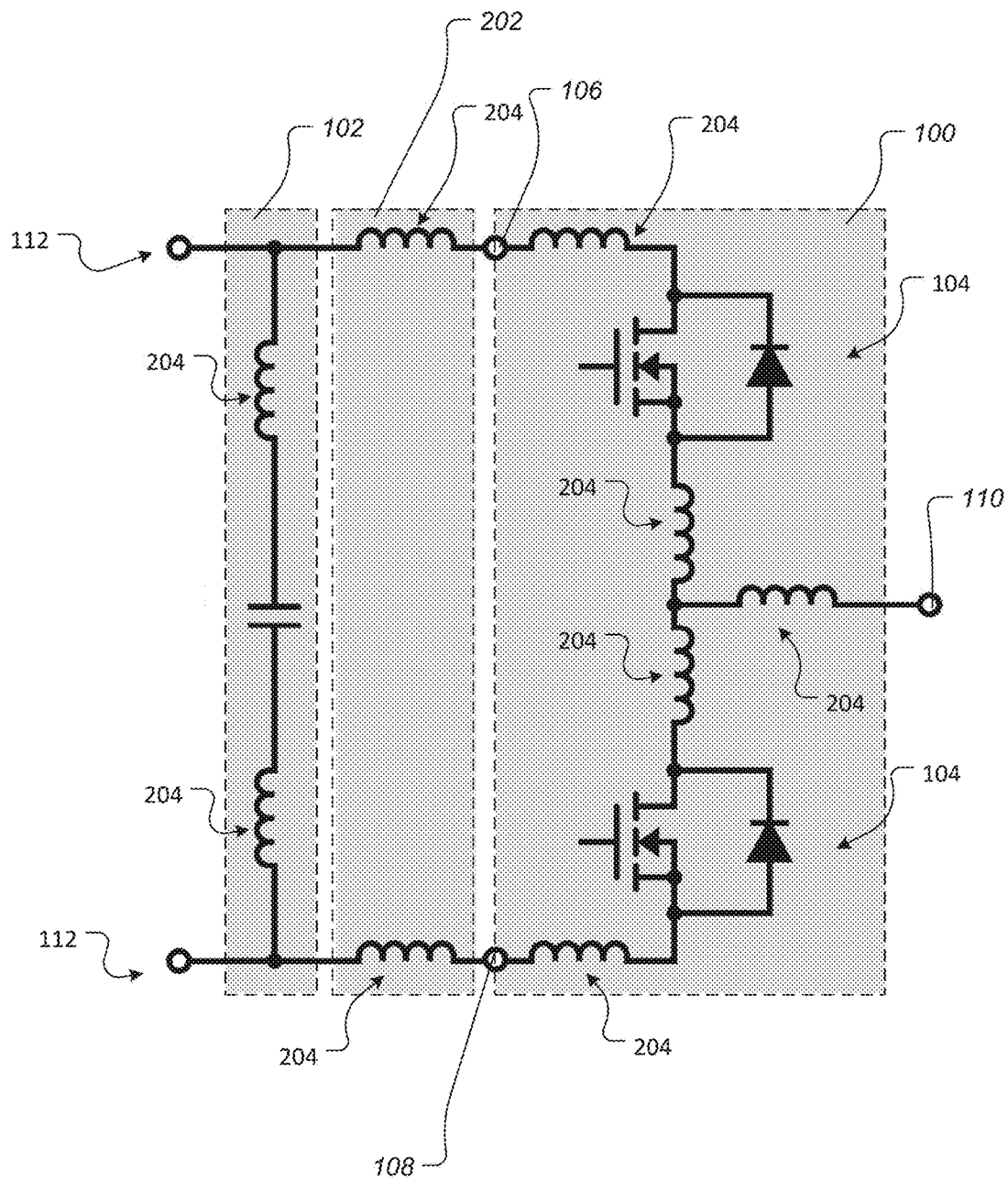
FIG. 2 illustrates various interconnections and associated impedances according to aspects of the disclosure.

FIG. 2 illustrates various interconnections and associated impedances according to aspects of the disclosure. For a power conversion system, such as the half-bridge configuration of the power module 100 presented in FIG. 1A, there are impedances 204 within each component including the DC link capacitors 102, a bussing system 202, and the power module 100, and the like and in the physical interconnections between them. This is depicted in FIG. 2 for the inductance. More functional elements and associated impedances are often present in power converters; however, for switching performance this loop may be the most significant.

In most power converters, these inductances must be carefully accounted for in the system design. Often, this requires adding more DC link capacitors 102 or slowing down the switching speed to counter the parasitic effects. While effective, it results in a bulkier system (more large and heavy capacitors) with higher losses (due to a slower switching event where both high currents and voltages are present).

In power packages intended for Si devices, the turn-on and turn-off times typical of a Si IGBT are inherently slow enough that the inductances encountered in the internal power loop are sufficiently low. However, for extremely fast switching of wide band gap devices, such as SiC MOSFETs, the inductances in conventional packages can result in voltage overshoots of hundreds of volts.

These issues are further amplified due to the need to parallel many SiC devices together to reach high current levels in a power module 100. A paralleled array of power switches and diodes in a variety of combinations (all switches, all diodes, interleaved diodes, edge diodes, etc.) is referred to as a 'position' or 'switch position'. Each switch in the switch position 104 acts together as a single effective switch, increasing the amount of current the circuit can process or reducing the overall loss by lowering the effective resistance.

Figure 3:
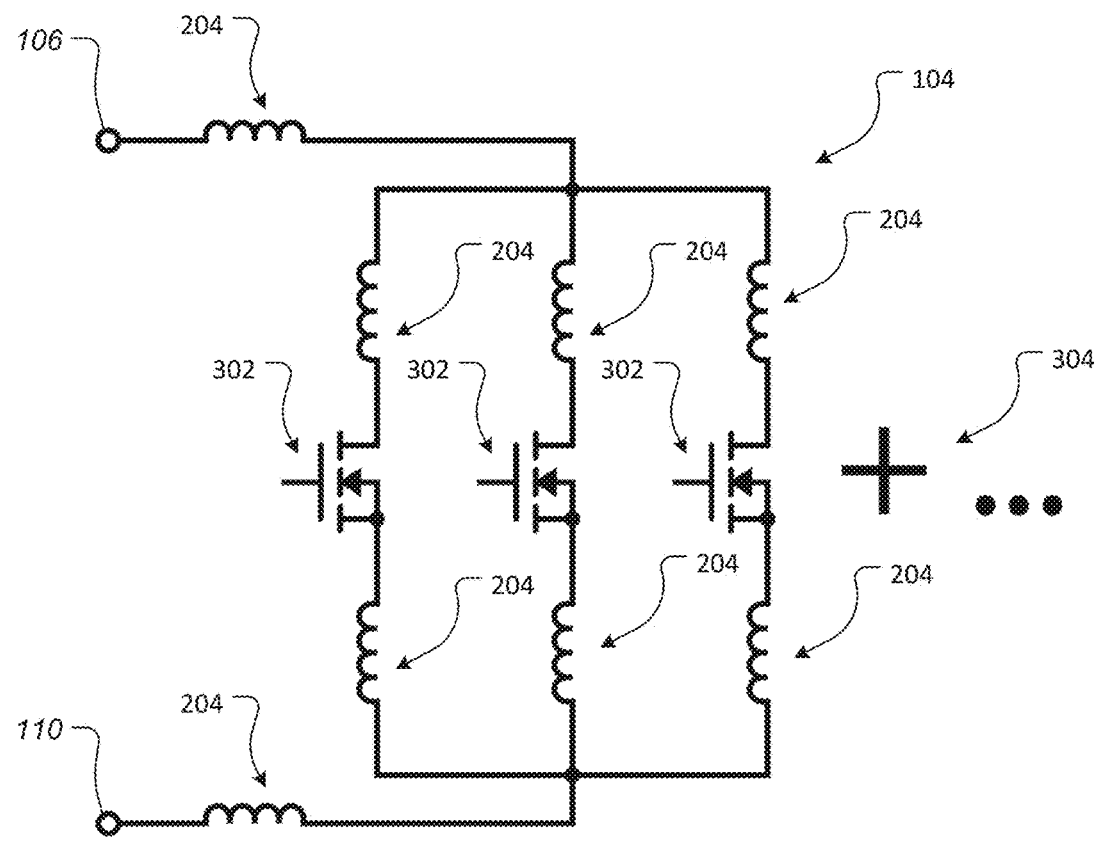
FIG. 3 illustrates various interconnections and associated impedances of a switch position according to aspects of the disclosure.

FIG. 3 illustrates various interconnections and associated impedances of a switch position according to aspects of the disclosure. In a switch position 104, each switch or power device 302 has its own individual current path in the structure. Each interconnection has an associated impedance 204, as illustrated in FIG. 3. As further shown in FIG. 3, the switch position 104 may include any number of power devices 302 as indicated by the symbology shown at arrow 304. Care must be taken to ensure that the effective current paths are equalized between the power devices 302, such that they each see matched inductances. Otherwise, the current and voltages encountered during switching transitions may not be equivalently shared between the power devices 302 across a switch position 104, unevenly stressing the components and increasing switching losses. This is exacerbated by thermal effects—uneven current loading and switching events create uneven heat rise, which results in a drift in semiconductor properties and more instability across a paralleled switch position 104.

Conventional power packages are typically designed for a single Si IGBT, or a small array of these devices (usually 4 or less). Consequently, they are not suitable for paralleling large numbers of SiC MOSFETs and diodes (or similar wide band gap devices) in a manner which results in clean, well-controlled switching.

The disclosed power module 100 provides a solution for the power devices 302, such as wide band gap devices, that may include one or more of the following non-limiting aspects:

Reduces the internal inductance of the power module 100.
Facilitates equalized current paths between paralleled power devices 302 in a switch position 104.
Equally shares heat between power devices 302 across a switch position 104.
Has an external structure that allows for low inductance interconnection with the DC link capacitors 102.
Is capable of safely carrying high currents (hundreds of amps) at high voltages (≥1700V).

It should be appreciated that these above-noted characteristics of the power module 100 are not required and may not be the implemented in some aspects of the disclosure.

Figure 4B:
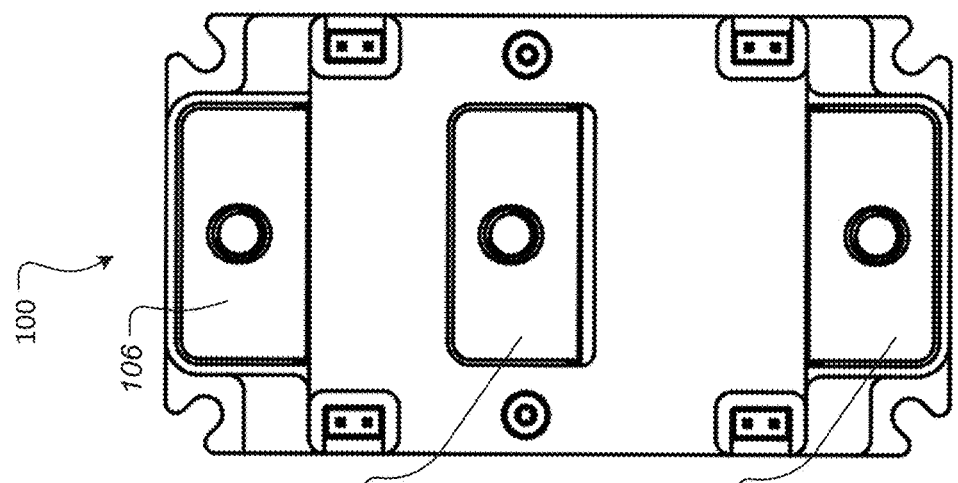
FIG. 4B illustrates a top schematic view of a power module according to an aspect of the disclosure.
Figure 4A:
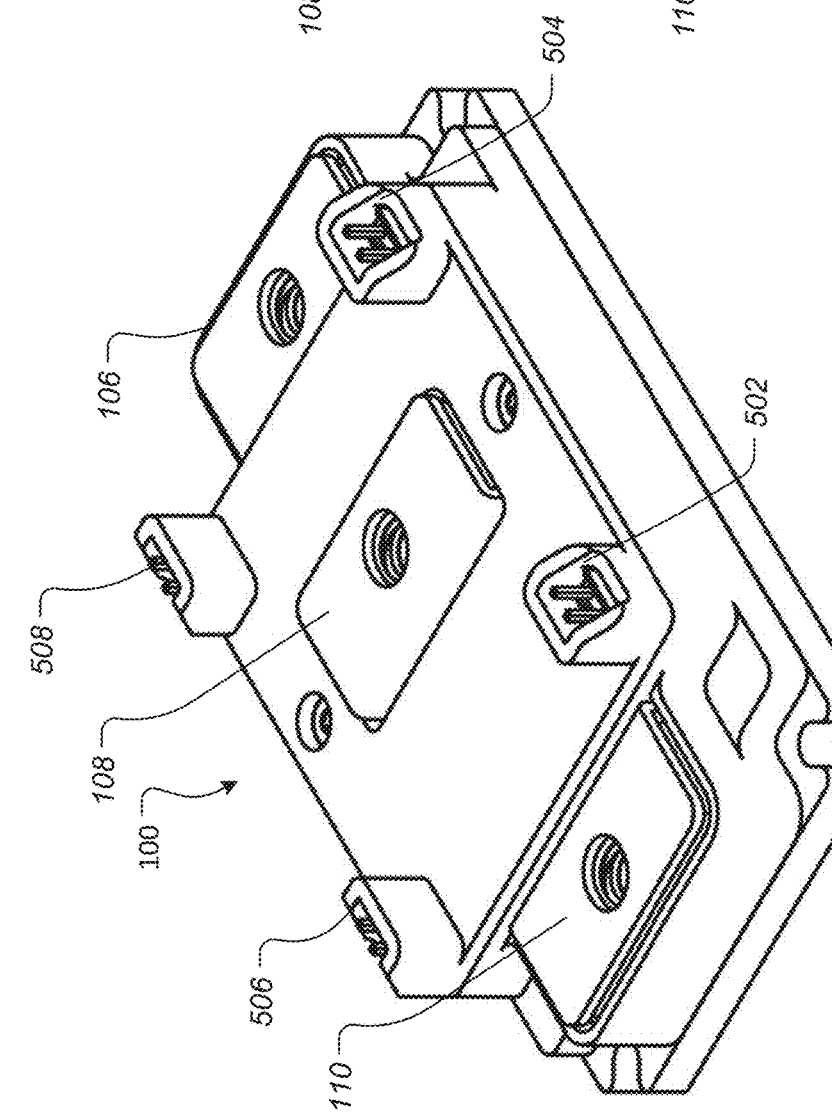
FIG. 4A illustrates a perspective schematic view of a power module according to an aspect of the disclosure.

FIG. 4A illustrates a perspective schematic view of a power module according to an aspect of the disclosure; and FIG. 4B illustrates a top schematic view of a power module according to an aspect of the disclosure. In particular, a half-bridge configuration of the power module 100 is illustrated in FIG. 4A and FIG. 4B. The disclosed power module 100 addresses each of the previously listed concerns with a custom designed power layout and associated structure to facilitate most common bridge topologies with each switch position 104 possessing an equalized, low inductance current path. The terminals 106, 108, 110 may be arranged such that the path to the external filtering DC link capacitors 102 may have a correspondingly low inductance as well, with uncomplicated laminated buss bars requiring no bends or special design features as described in greater detail below.

A power terminal pin-out of a single half-bridge configuration of the power module 100 is depicted in FIG. 4A. The V+ terminal 106 and V-terminal 108 may be placed intentionally close together (with enough space for voltage clearances) to physically minimize the external current loop to the DC link capacitors 102.

The power module 100 may include signal terminals 502, 504, 506, 508. The specific pin-out of the signal terminals 502, 504, 506, 508 may be modular and may be modified as necessary. The configuration is illustrated in FIG. 4A. As shown, there are four pairs of signal pins for the signal terminals 502, 504, 506, 508 for differential signal transfer. Of course, any number of signal pins and any number of signal terminals may be implemented to provide the functionality as described in conjunction with the disclosure. Each switch position 104 may utilize a pair of pins with the terminals 502, 504 for the gate signal and a source kelvin for optimal control. The other pin pairs of the signal terminals 506, 508 may be used for an internal temperature sensor, overcurrent sensing, or for other diagnostic signals. It is contemplated that more pins and/or more signal terminals may also be added to any of the rows if necessary, as long as they do not result in voltage isolation issues. In some aspects, the other diagnostic signals may be generated from diagnostic sensors that may include strain gauges sensing vibration, and the like. The diagnostic sensors can also determine humidity. Moreover, the diagnostic sensors may sense any environmental or device characteristic.

Figure 5:
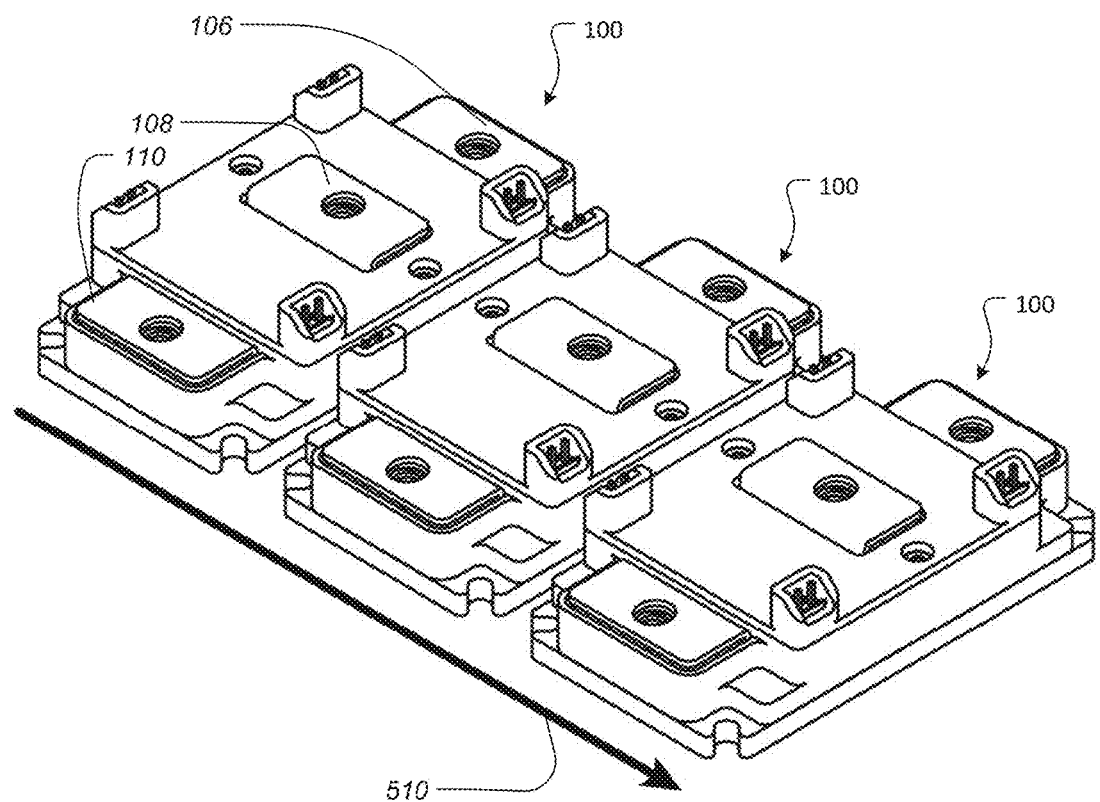
FIG. 5 illustrates a plurality of single phase modules in a paralleled configuration according to aspects of the disclosure.

FIG. 5 illustrates a plurality of single phase modules in a paralleled configuration according to aspects of the disclosure. Modularity is fundamental to the disclosed power module 100. A single phase configuration of the power module 100 may be easily paralleled to reach higher currents. As is illustrated in FIG. 5 there are three power modules 100 illustrated, but there is no limit to how many could be configured in this manner. In this regard, arrow 510 shows that additional power modules 100 may be arranged in parallel. When paralleled, each of the corresponding terminals 106, 108, 110 may be electrically connected between each of the power modules 100.

Figures 6A, 6B:
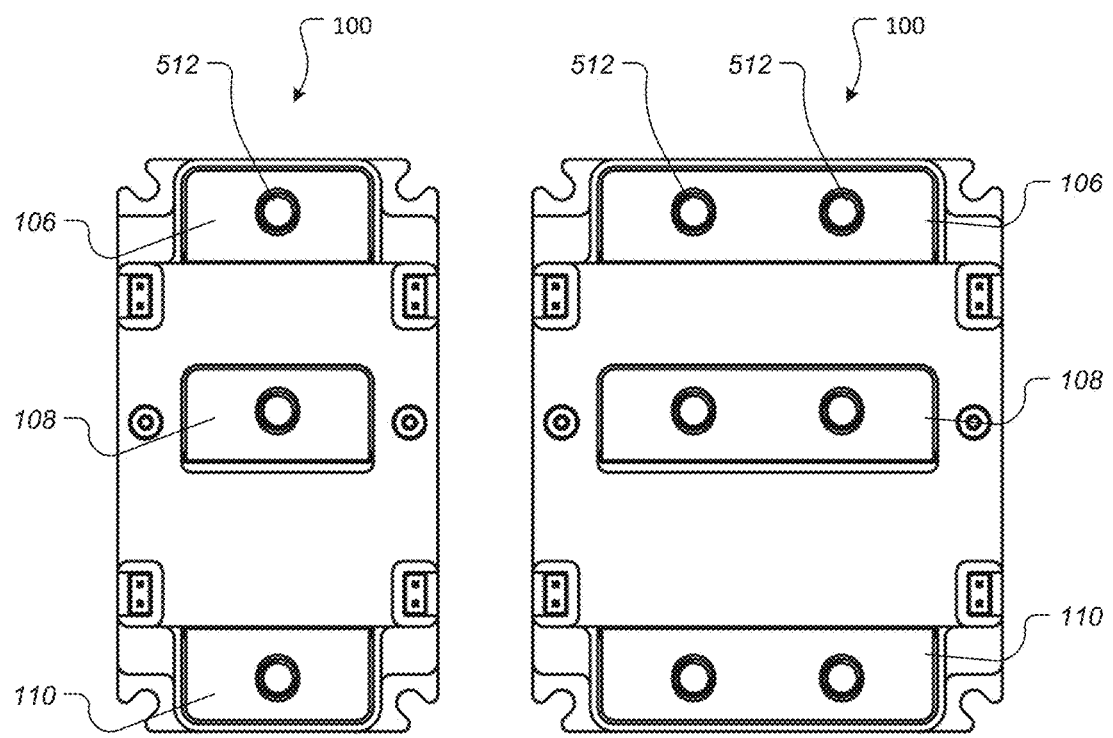
FIG. 6A illustrates a first power module configuration according to aspects of the disclosure.
FIG. 6B illustrates a second power module configuration according to aspects of the disclosure.

FIG. 6A illustrates a first power module configuration according to aspects of the disclosure; and FIG. 6B illustrates a second power module configuration according to aspects of the disclosure. Scalability of the disclosed power modules 100 may be another defining feature. This is depicted in FIGS. 6A and 6B. As shown in FIG. 6B, the power module 100 width may be extended to accommodate more paralleled devices for each switch position 104 in comparison to the power module 100 shown in FIG. 6A. Additional fastener holes 512 may be added to the power contacts of the terminals 106, 108, 110 due to the increased current of the power module 100. It is important to note that the power modules 100 may be paralleled as shown in FIG. 5 or may be scaled as shown in FIG. 6B to match most power levels without sacrificing the benefits of this disclosure including, for example, low inductance, clean switching, high power density, and the like.

Figure 7:
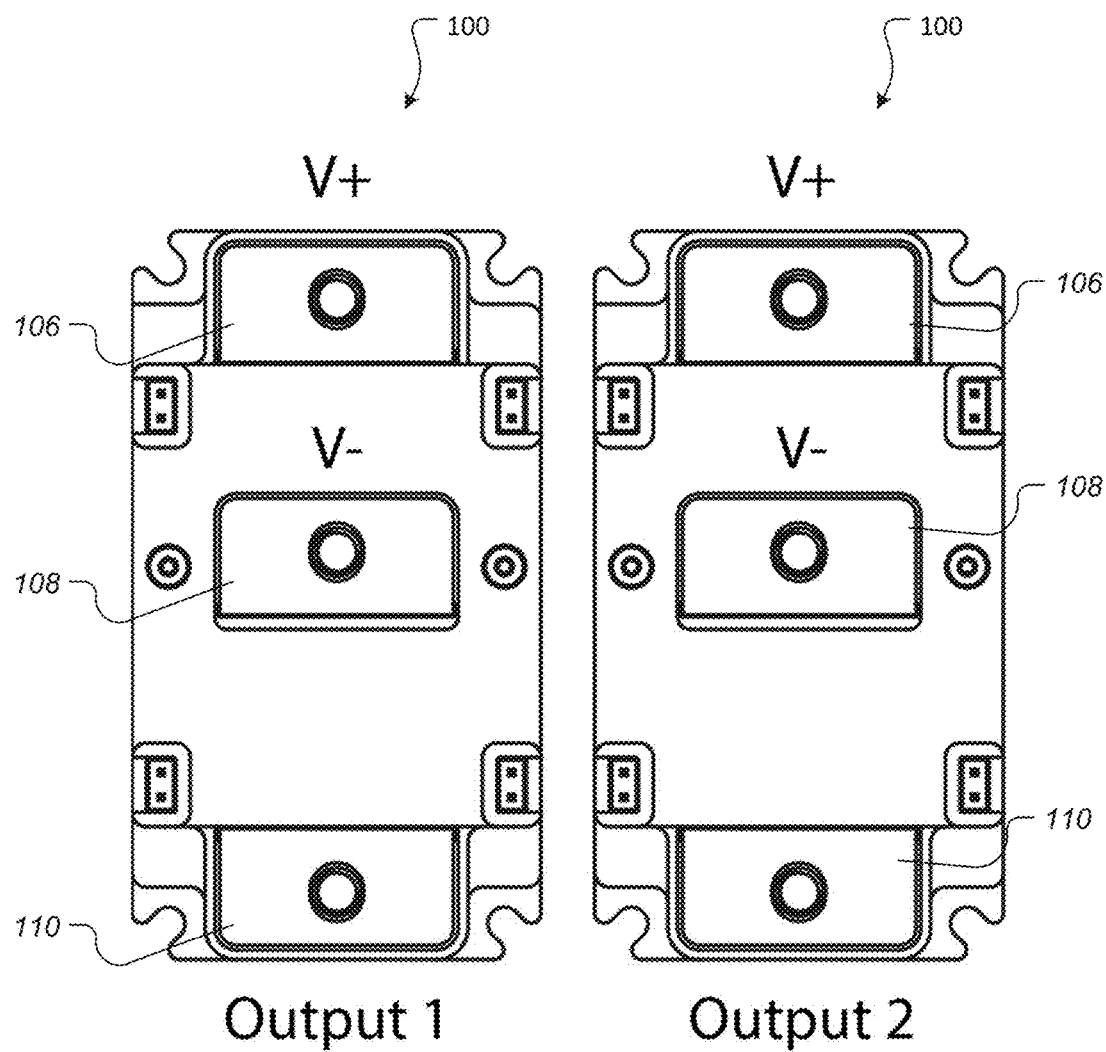
FIG. 7 illustrates a plurality of power modules in a full bridge configuration according to aspects of the disclosure.
Figure 8:
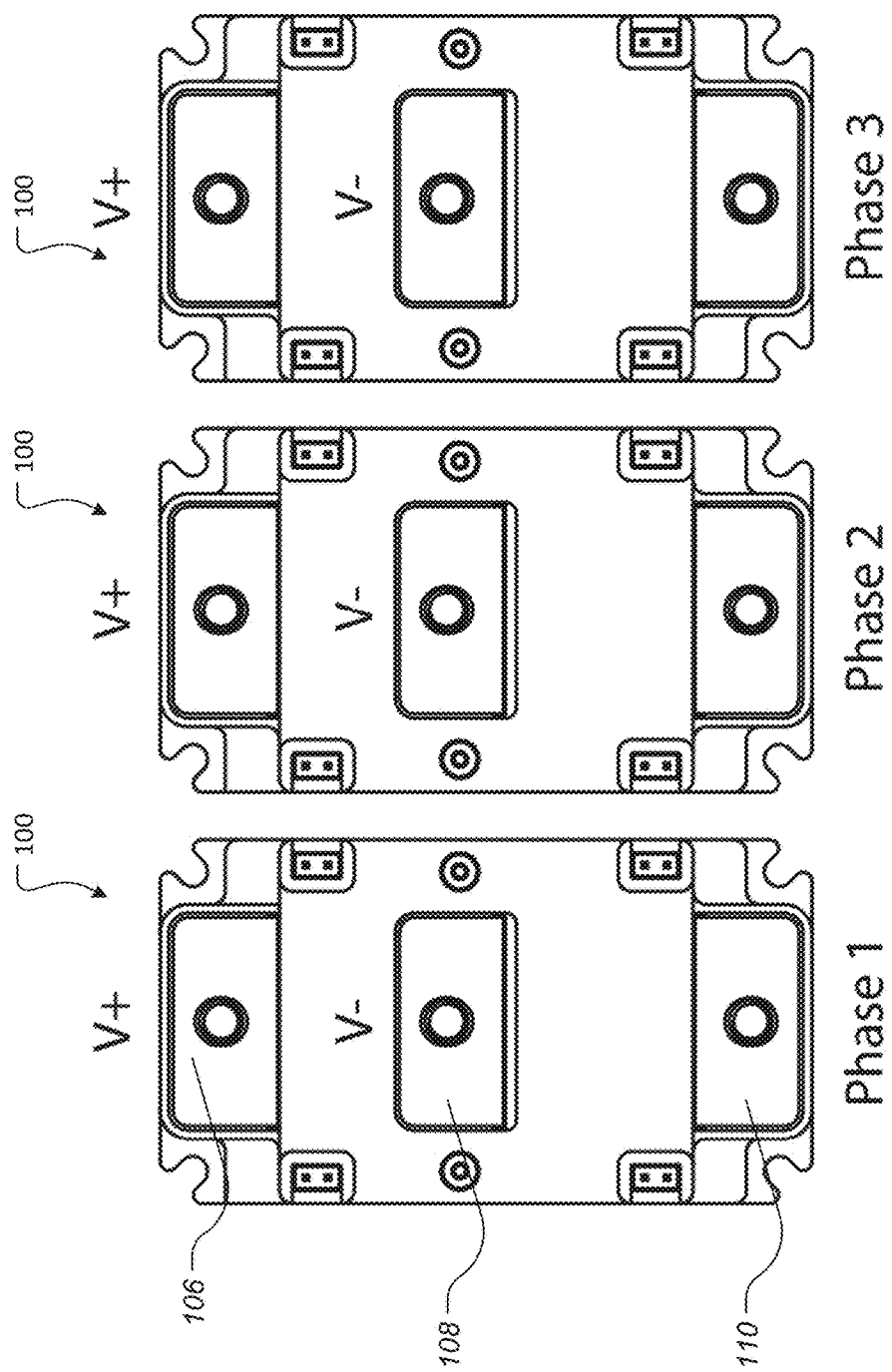
FIG. 8 illustrates a plurality of power modules in a three-phase configuration according to aspects of the disclosure.
Figure 9:
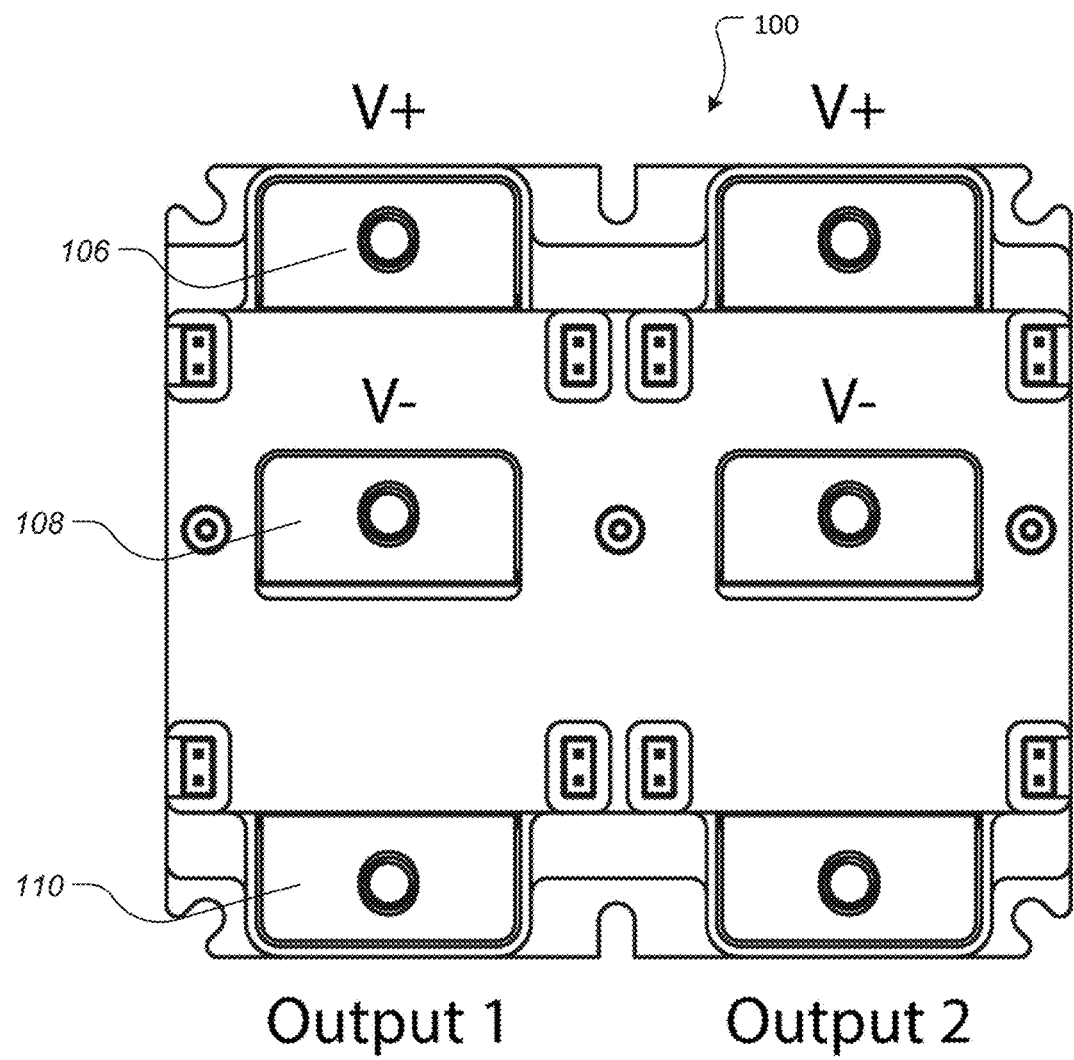
FIG. 9 illustrates a single power module having a full bridge configuration according to aspects of the disclosure.

FIG. 7 illustrates power modules in a full bridge configuration according to aspects of the disclosure; FIG. 8 illustrates a power module in a three-phase configuration according to aspects of the disclosure; and FIG. 9 illustrates a single power module having a full bridge configuration according to aspects of the disclosure. In some aspects, modularity may also be found in the formation of various electrical topologies, such as FIG. 7 for a full-bridge configuration of two power modules 100 and FIG. 8 for a three-phase configuration of three power modules 100. For these topologies, the V+ terminal 106 and V− terminal 108 may be interconnected while the phase output terminals 110 may remain separate. The configuration of FIG. 7 and FIG. 8 may also be placed in a single housing and may be configured with a shared base plate as illustrated in FIG. 9, which may increase power density with the tradeoff of higher unit complexity and cost.

While the various arrangements, configurations, and scaled width version of the power module 100 cover a range of applications and power levels, the core internal components and layouts may remain identical. This reinforces the modular nature of the disclosed power module 100. This structure encompasses a family of modules showcasing a high level of performance while being easy to use and to grow with a range of customer specific systems.

Figure 10:
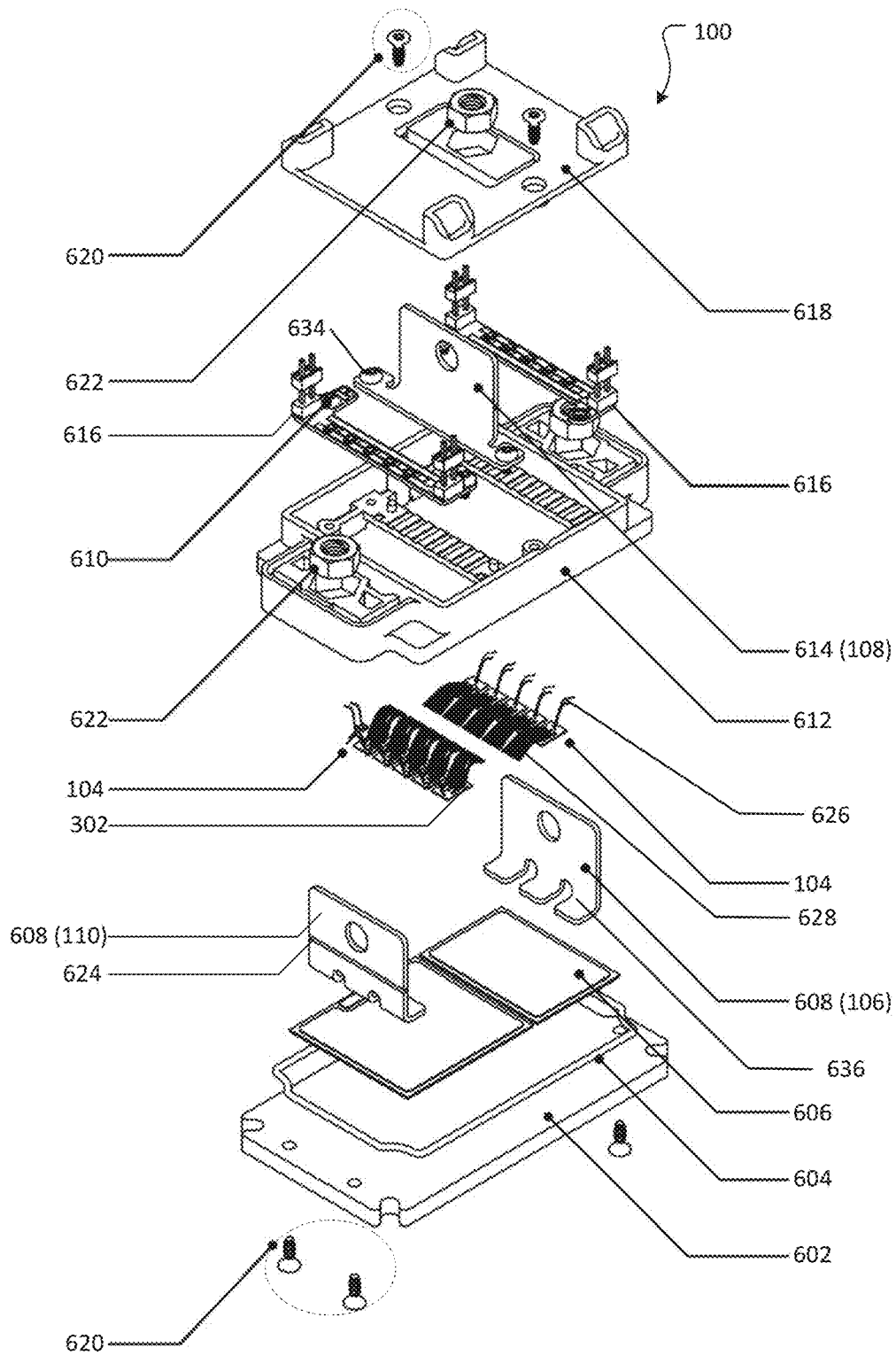
FIG. 10 illustrates an exploded view of the power module according to aspects of the disclosure.
Figure 11:
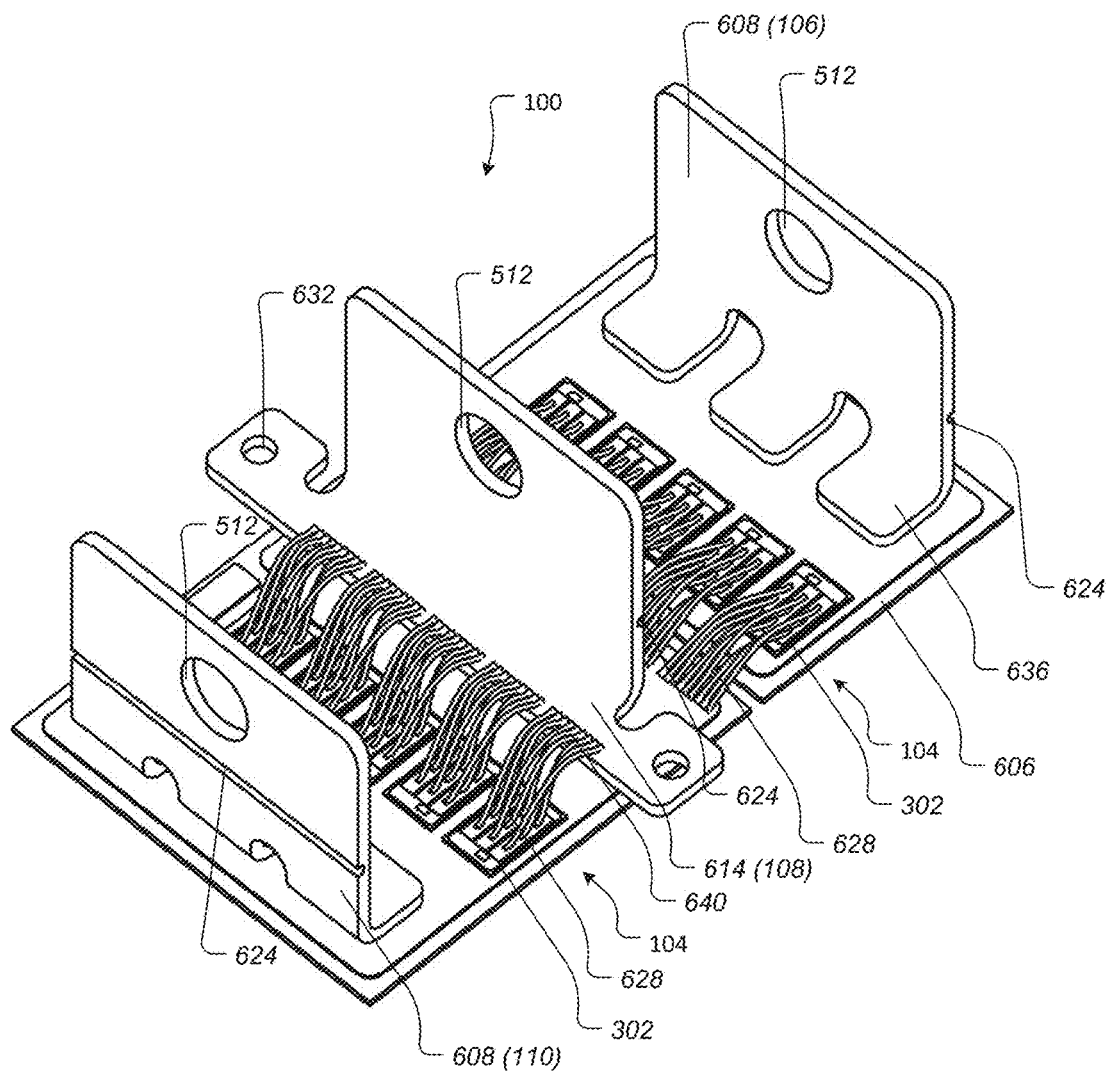
FIG. 11 illustrates a partial view of the power module of FIG. 10.

FIG. 10 illustrates an exploded view of the power module according to aspects of the disclosure; and FIG. 11 illustrates a partial view of the power module of FIG. 10. In particular, FIG. 10 illustrates a number of elements in the power module 100. These elements include one or more of a base plate 602, a gasket 604, one or more power substrates 606, one or more edge power contacts 608, one or more switch positions 104, one or more temperature sensors 610, housing sidewalls 612, a center power contact 614, a signal interconnection assembly 616, a housing lid 618, fasteners 620, captive fasteners 622, and the like. Moreover, it is contemplated that the power module 100 may include fewer or different elements than those described herein.

The power module 100 may include the base plate 602. The base plate 602 may provide structural support to the power module 100 as well as facilitating heat spreading for thermal management of the power module 100. The base plate 602 may include a base metal, such as copper, aluminum, or the like, or a metal matrix composite (MMC) which may provide coefficient of thermal expansion (CTE) matching to reduce thermally generated stress. In one aspect, the MMC material may be a composite of a high conductivity metal such as copper, aluminum, and the like, and either a low CTE metal such as molybdenum, beryllium, tungsten, and/or a nonmetal such as diamond, silicon carbide, beryllium oxide, graphite, embedded pyrolytic graphite, or the like. Depending on the material, the base plate 602 may be formed by machining, casting, stamping, or the like. The base plate 602 may have a metal plating, such as nickel, silver, gold and/or the like, to protect surfaces of the base plate 602 and improve solder-ability. In one aspect, the base plate 602 may have a flat backside. In one aspect, the base plate 602 may have a convex profile to improve planarity after reflow. In one aspect, the base plate 602 may have pin fins for direct cooling.

The power module 100 may include the gasket 604. The gasket 604 may improve an encapsulation process by providing a liquid tight seal. In this regard, the power module 100 may include dielectric encapsulation within. The gasket 604 may be injection molded, dispensed, or the like, and may be applied in a groove in the housing sidewalls 612 and compressed between the housing sidewalls 612 and the base plate 602.

The power module 100 may include one or more power substrates 606. The one or more power substrates 606 may provide electrical interconnection, voltage isolation, heat transfer, and the like for the power devices 302. The one or more power substrates 606 may be constructed as a direct bond copper (DBC), an active metal braze (AMB), an insulated metal substrate (IMS), or the like. In the case of the IMS structure, the one or more power substrates 606 and the base plate 602 may be integrated as the same element. In some aspects, the one or more power substrates 606 may be attached to the base plate 602 with solder, thermally conductive epoxy, silver sintering or the like. In one aspect there may be two power substrates 606, one for each switch position 104.

The power module 100 may include one or more edge power contacts 608. A surface of one of the one or more edge power contacts 608 may form the V+ terminal or first terminal 106. A surface of one of the one or more edge power contacts 608 may form the phase terminal or third terminal 110. The one or more edge power contacts 608 may create a high current path between an external system and the one or more power substrates 606. The one or more edge power contacts 608 may be fabricated from sheet metal through an etching process, a stamping operation, or the like. The one or more edge power contacts 608 may have a partial thickness bend assist line 624 to facilitate bending of the one or more edge power contacts 608 to aid in final assembly. In one aspect, the one or more edge power contacts 608 may be folded over the captive fastener 622. In one aspect, the one or more edge power contacts 608 may be soldered, ultrasonically welded, or the like directly to the power substrate 606. The one or more edge power contacts 608 may have a metal plating, such as nickel, silver, gold, and/or the like to protect the surfaces and improve solder-ability.

In one aspect, a base 636 of the edge power contact 608 may be split into feet to aid in the attach process. The base 636 may have a metal plating, such as nickel, silver, and/or gold to protect the surfaces and improve solder-ability.

The power module 100 may further include one or more switch positions 104. The one or more switch positions 104 may include the power devices 302 that may include any combination of controllable switches and diodes placed in parallel to meet requirements for current, voltage, and efficiency. The power devices 302 may be attached with solder, conductive epoxy, a silver sintering material, or the like. The upper pads on the power devices 302, including the gate and the source, may be wire bonded to their respective locations with power wire bonds 628. The power wire bonds 628 may include aluminum, an aluminum alloy, copper, or the like wires, which may be ultrasonically welded, or the like at both feet, forming a conductive arch between two metal pads. Signal bonds 626 may be formed in a similar manner and may be aluminum, gold, copper, or the like. In some aspects, the diameter of the wire of the power wire bonds at 626 may be smaller than the wire of the power wire bonds 628.

The power module 100 may further include one or more temperature sensors 610. The one or more temperature sensors 610 may be implemented with resistive temperature sensor elements attached directly to the power substrate 606. Other types of temperature sensors are contemplated as well including resistance temperature detectors (RDTs) type sensors, Negative Temperature Coefficient (NTC) type sensors, optical type sensors, thermistors, thermocouples, and the like. The one or more temperature sensors 610 may be attached with solder, conductive epoxy, a silver sintering material, or the like, and then may be wire bonded to the signal interconnection assembly 616. The power module 100 may further include one or more diagnostic sensors that may include strain gauges sensing vibration, and the like. The diagnostic sensors can also determine humidity. Moreover, the diagnostic sensors may sense any environmental or device characteristic.

The power module 100 may further include housing sidewalls 612. The housing sidewalls 612 may be formed of a synthetic material. In one aspect, the housing sidewalls 612 may be an injection molded plastic element. The housing sidewalls 612 may provide electrical insulation, voltage creepage and clearance, structural support, and cavities for holding a voltage and moisture blocking encapsulation. In one aspect, the housing sidewalls 612 may be formed in an injection molding process with reinforced high temperature plastic.

The power module 100 may further include the center power contact 614. A surface of the center contact 614 may form the V− terminal or second terminal 108. The center power contact 614 may create a high current path between an external system and the power devices 302. The center power contact 614 may be fabricated from sheet metal through an etching process, a stamping operation, or the like. The center power contact 614 may be isolated from the underlying power substrate 606 by being embedded in the housing sidewalls 612 (as illustrated) or may be soldered or welded to a secondary power substrate as described below. The center power contact 614 may include one or more apertures 632 as shown in FIG. 11 for receiving a corresponding fastener 634 that fastens the center power contact 614 to the housing sidewalls 612.

The low side switch position power devices 302 may be wire bonded 640 directly from their terminals to the center power contact 614 as illustrated in FIG. 11. The center power contact 614 may have a partial thickness bend assist line 624 to aid in folding at the final assembly stage. The center power contact 614 may have a metal plating, such as nickel, silver, gold, and/or the like to protect the surfaces and improve bond-ability.

The power module 100 may further include the signal interconnection assembly 616. The signal interconnection assembly 616 may be a small signal circuit board facilitating electrical connection from the signal contacts to the power devices 302. The signal interconnection assembly 616 may allow for gate and source kelvin connection, as well as connection to additional nodes or internal sensing elements. The signal interconnection assembly 616 may allow for individual gate resistors for each of the power devices 302. The signal interconnection assembly 616 may be a printed circuit board, ceramic circuit board, flex circuit board, embedded metal strips, or the like arranged in the housing sidewalls 612. In one aspect, the signal interconnection assembly 616 may include a plurality assemblies. In one aspect, the signal interconnection assembly 616 may include a plurality assemblies, one for each switch position 104.

The power module 100 may further include the housing lid 618. The housing lid 618 may be a synthetic element. In one aspect, the housing lid 618 may be an injection molded plastic element. The housing lid 618 may provide electrical insulation, voltage creepage and clearance, and structural support. In this regard, the housing lid 618 together with the housing sidewalls 612 may form a closed assembly. The closed assembly may prevent the ingress of foreign materials from entering the interior of the power module 100. In one aspect, the housing lid 618 may be formed in an injection molding process with reinforced high temperature plastic.

The power module 100 may further include the fasteners 620. The fasteners 620 may be thread forming screws. Other types of fasteners are contemplated as well. The fasteners 620 may be used to screw directly into the housing sidewalls 612 to fasten down multiple elements in the power module 100. The fasteners 620 may be used for housing lid 618 attachment, signal interconnection assembly 616 attachment, embedding the center power contact 614 (if it is not embedded through another means), for fastening the housing sidewalls 612 to the base plate 602, and the like.

The power module 100 may further include the captive fasteners 622. The captive fasteners 622 may be hex nuts placed in the housing sidewalls 612 and housing lid 618 and may be held captive underneath the edge power contacts 608 and the center power contact 614 after they are folded over. Other types of fasteners or connectors are contemplated to implement the captive fasteners 622. The captive fasteners 622 may facilitate electrical connection to external buss bars or cables. The captive fasteners 622 may be arranged such that when the power module 100 is bolted to buss bars, the captive fasteners 622 and the edge power contacts 608 are pulled upwards into the bussing, forming a better quality electrical connection. If the captive fasteners 622 were affixed to the housing, they could act to pull the bussing down into the power module 100, which could form a poor connection due to the stiffness of the buss bars.

In one aspect, the housing lid 618 may include an aperture having a shape consistent with the external shape of the captive fasteners 622 to prevent the captive fasteners 622 from rotating. A corresponding fastener (shown in FIG. 26) may be received by the captive fasteners 622. The corresponding fastener extending through a fastener hole 512 in the center power contact 614 to facilitate electrical connection to external buss bars or cables.

In one aspect, the housing sidewalls 612 may include an aperture having a shape consistent with the external shape of the captive fasteners 622 to prevent the captive fasteners 622 from rotating. A corresponding fastener (shown in FIG. 26) may be received by the captive fasteners 622. The corresponding fastener extending through a fastener hole 512 in the one or more edge power contacts 608 to facilitate electrical connection to external buss bars or cables.

To achieve a low internal inductance, current paths of the power module 100 may be wide, short in length, and overlap whenever possible to achieve flux cancellation. Flux cancellation occurs when the current traveling through the loop moves in opposing directions in close proximity, effectively counteracting their associated magnetic fields. A principal benefit of this module approach is that the entire width of the footprint is utilized for conduction. Module height may be minimized to reduce a length the current must travel through the structure.

The power loop for a half-bridge phase leg is illustrated in FIG. 11, with the edge power contacts 608 and center power contact 614 folded up to show detail. The wide, low profile edge power contact 608 and center power contact 614 brings in the current directly to the power devices 302. The effective current path from the terminal surfaces to individual power devices 302 may be functionally equivalent. Additionally, the power devices 302 may be placed in close proximity, minimizing imbalances in their relative loop inductances and ensuring excellent thermal coupling.

Figure 12:
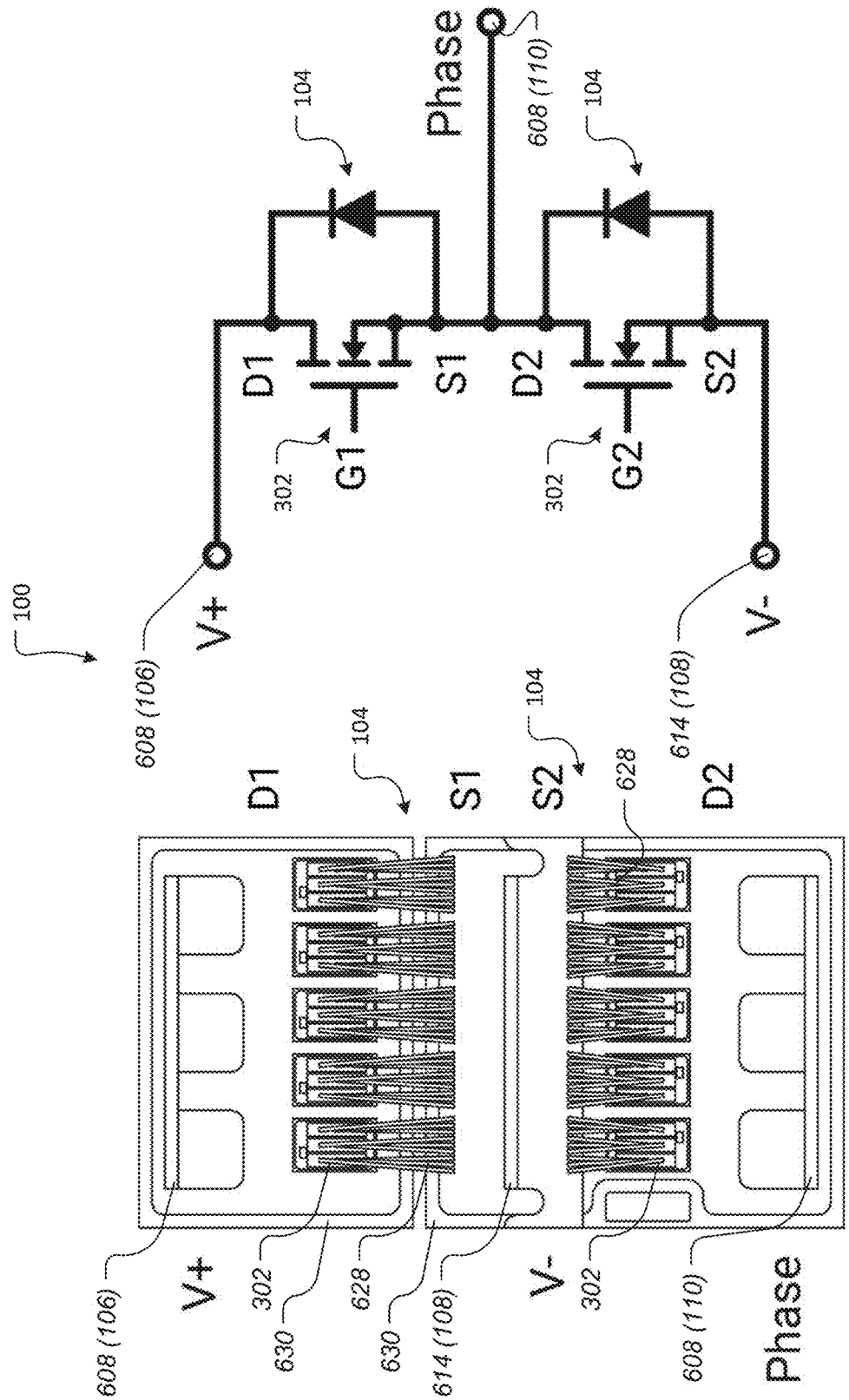
FIG. 12A illustrates a top view of the phase leg of the power module constructed according to the disclosure, with each node identified in a half-bridge topology.
FIG. 12B illustrates a schematic of the phase leg of the power module constructed according to the disclosure, with each node identified in a half-bridge topology according to FIG. 12A.

FIG. 12A illustrates a top view of the phase leg of the power module constructed according to the disclosure, with each node identified in a half-bridge topology; and FIG. 12B illustrates a schematic of the phase leg of the power module constructed according to the disclosure, with each node identified in a half-bridge topology according to FIG. 12A. The power module 100 may include one or more diodes. In one aspect, the diode in the schematic may be a discrete diode placed in antiparallel (not illustrated). In one aspect, the diode in the schematic may be a representation of the body diode of the power device 302 implemented as a MOSFET (as illustrated).

In one aspect, the current path may begin at the V+ node terminal 608, which may be attached to the power substrate 630 and drains D1 of the upper one of the power devices 302. The sources S1 of the upper one of the power devices 302 may then wire bonded 628 to a lower power substrate pad 630, which is attached to the drains D2 of the low side power devices 302, as well as the phase power terminal 608. Finally, the sources S2 of the low side power devices 302 may be wire bonded 628 to the V− power contact terminal 614, which may be above the lower power substrate 630 providing some overlap and may be sufficiently voltage isolated from the underlying substrate 630.

Figure 13:
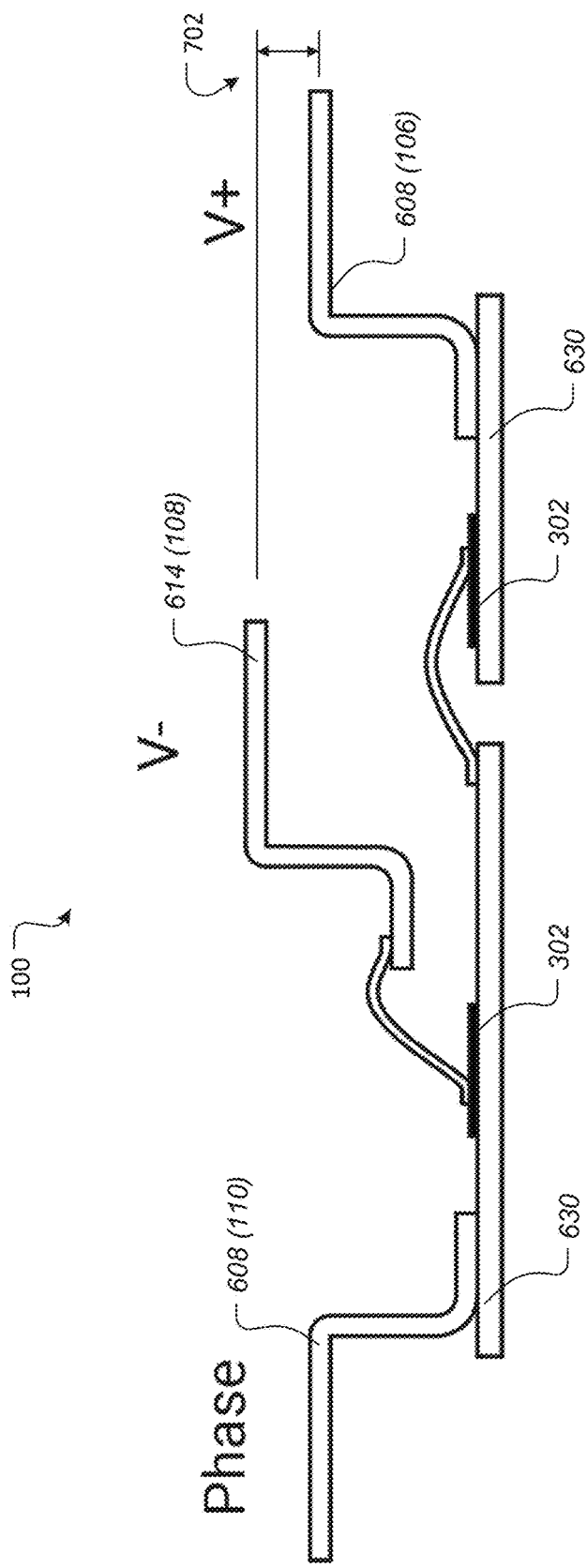
FIG. 13 illustrates a cross section view of the phase leg of FIG. 12A and FIG. 12B.
Figure 14:
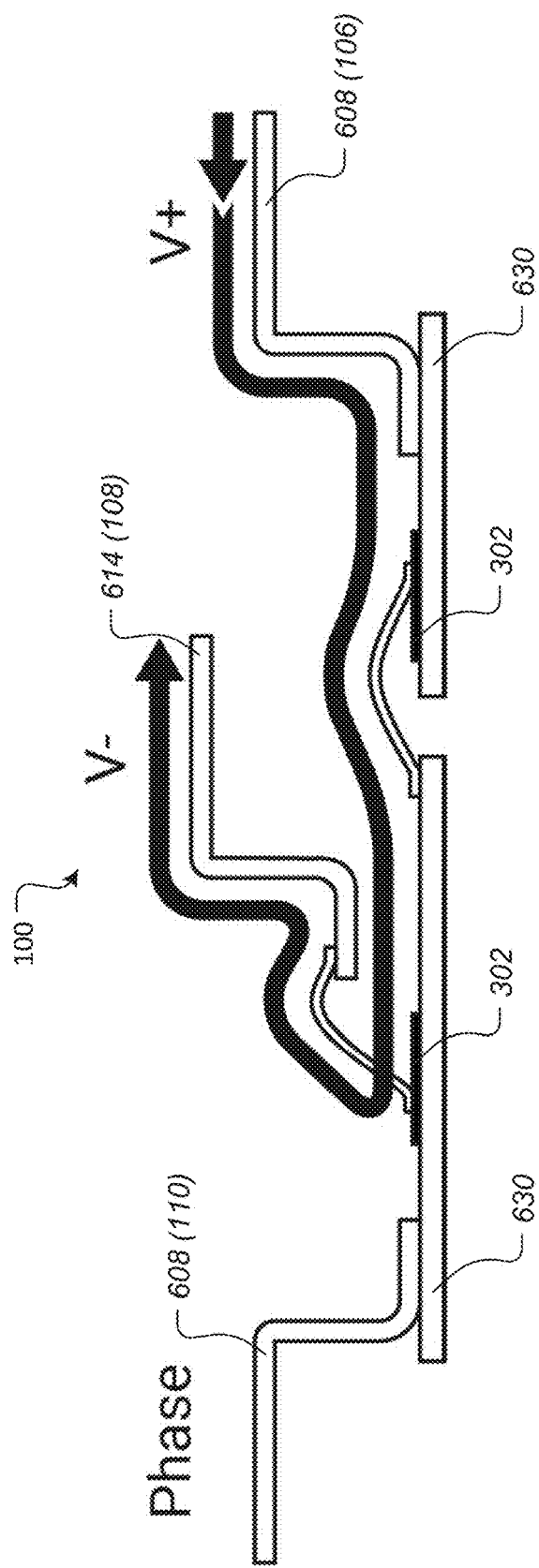
FIG. 14 illustrates a cross section view of the phase leg of FIG. 12A and FIG. 12B that includes a current path.

FIG. 13 illustrates a cross section view of the phase leg of FIG. 12A and FIG. 12B; and FIG. 14 illustrates a cross section view of the phase leg of FIG. 12A and FIG. 12B that includes a current path. As shown in FIG. 13, tabs of the power contacts or terminals 106, 108, 110 are folded over as they are in the final configuration of the power module 100 structure. Layer thicknesses are exaggerated to show detail. All elements in this figure can be considered to be conductors when visualizing current flow.

FIG. 13 further illustrates the terraced, multiple height, or multiple elevation configuration of the power module 100. In this regard, a vertical position of the terminal 614 is shown higher than the vertical position of the terminal 608. The height difference is indicated by arrow 702. This multiple height configuration may provide the critical loop described in greater detail below. Moreover, the multiple height configuration may assist in providing a buss connection, which is further described below as well.

FIG. 14 presents an overlay of the current path from the V+ terminal to the V− terminal, representing the critical loop for clean switching according to aspects of the disclosure. Inductance is proportional to a path length, lessens with increased cross-sectional area of the conductors, and is reduced with flux cancellation in the magnetic field. The identified path starts at terminal 608 and flows through the power substrate 630 across the power devices 302 on to a second substrate 630 through power device 302 and output by the terminal 614. The identified path is low inductance, owing to the following factors:

Low height of the module.
Close proximity of the power device 302 to the terminals 608, 614.
Tight packing of all functional elements.
Wide cross-sectional area of the conductors.
Optimized paralleled wire bonds 628 for each power device 302.
Even current sharing between the power devices 302.
Flux cancellation when the current direction reverses in the low side switch position.
Flux cancellation in the external V+/V− buss bars.

Figure 15:
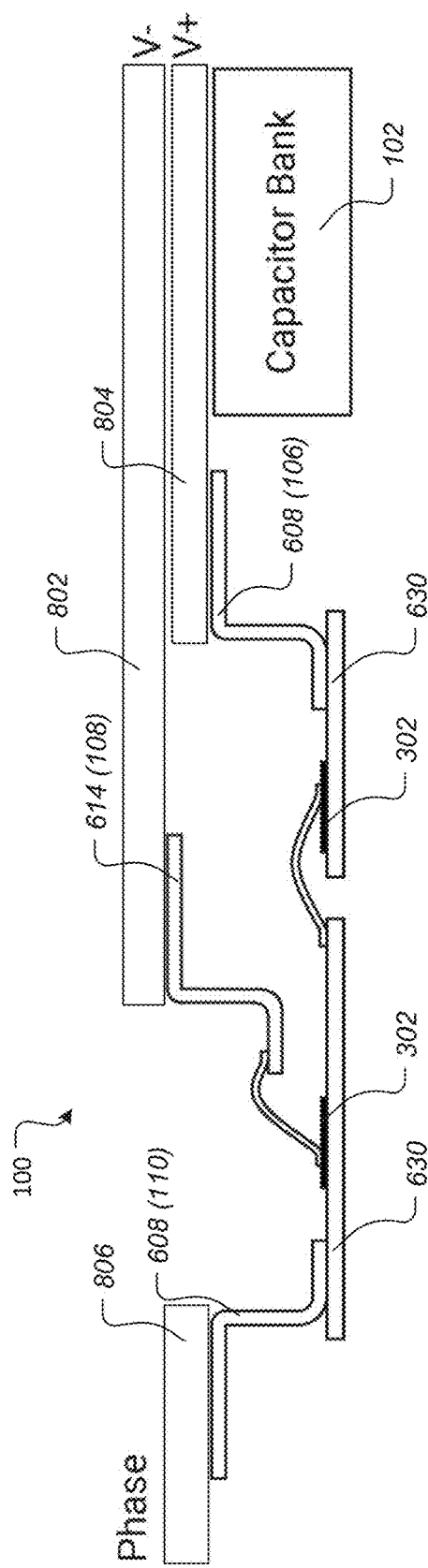
FIG. 15 illustrates contact surfaces of the power module together with bussing according to an aspect of the disclosure.

FIG. 15 illustrates contact surfaces of the power module together with bussing according to an aspect of the disclosure. The contact surfaces of the V+ terminal 608 and phase terminal 608 may be planar, while the top of the V− terminal 614 is offset from the others. This feature allows for the external V+/V− laminated bussing 802, 804 to contact both terminals 608, 614, without requiring a bend in the laminated bussing 802, 804, as illustrated in FIG. 15. The offset distance 702 (illustrated in FIG. 13) may be adjusted to match the thickness of the buss bar metal and an associated dielectric isolation film.

The low internal module inductance combined with the minimized external inductance in the bussing 802, 804, 806 to the DC link capacitors 102 bank results in an optimized structure of the power module 100 for clean, rapid switching events with low voltage overshoot and stable performance. Less loop inductance results in a reduced total capacitance required on the DC link capacitors 102.

These benefits, altogether, allow for lower switching losses, higher switching frequencies, improved controllability, and reduced EMI. Ultimately, this helps system designers achieve more power dense and robust power conversion systems.

Figure 16:
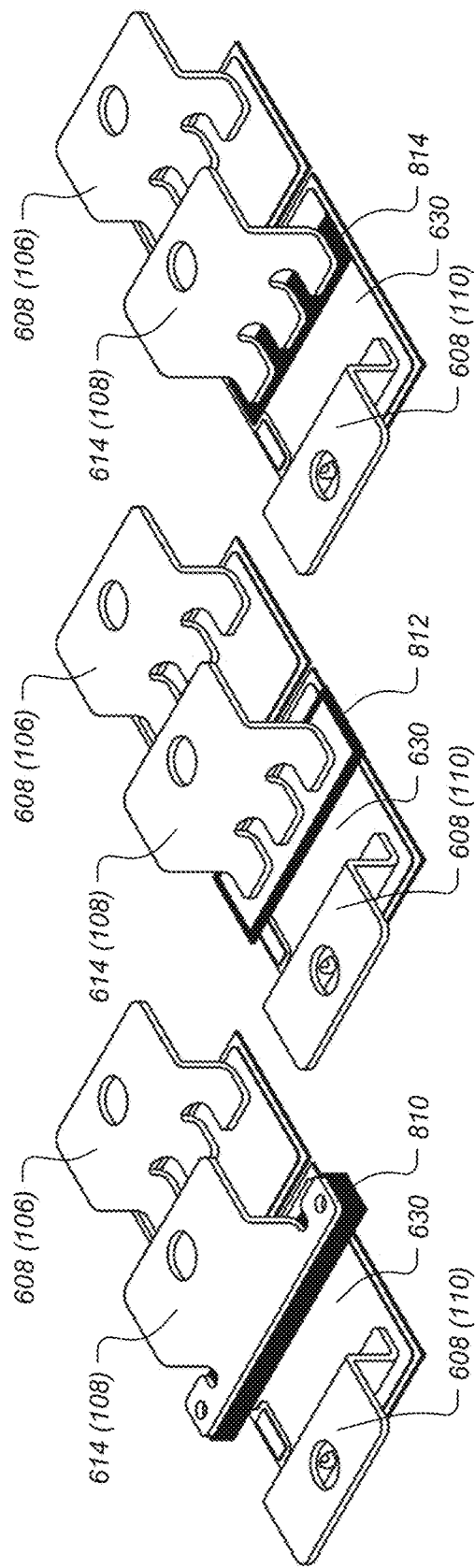
FIGS. 16A, 16B, and 16C illustrate various aspects of a terminal of the power module according to aspects of the disclosure.

FIGS. 16A, 16B, and 16C illustrate various aspects of a terminal of the power module according to aspects of the disclosure. A multilayer layout where the V− terminal 614 is in the middle of the power module 100 may be essential to this design. Suitable voltage isolation of this terminal 614, which lays directly over an output trace on the power substrate 630, may be realized through a variety of constructions that form an isolation structure. This power module 100 design is compatible with each of the following:

FIG. 16A illustrates one aspect of the isolation of the V− terminal 614. In this aspect, the power module 100 may include an embedded isolation 810 of the V− terminal 614. The embedded isolation 810 may be formed with a plastic or other synthetic material. The embedded isolation 810 may be located in the housing sidewalls 612 as a strip 810 bridging a center region. In one aspect, the strip 810 may be formed of plastic. The power contact 614 may be embedded in the strip 810 through a number of methods, including mechanical fastening such as with a thread forming screw, direct integration such as through a plastic over-molding process, riveted in place with a plastic heat staking operation, or the like.

FIG. 16B illustrates another aspect of the isolation of the V− terminal 614. In this aspect, the power module 100 may form the isolation of the V− terminal 614 by a power substrate isolation. In this regard, a secondary power substrate 812 may be utilized to provide the isolation through its layer of dielectric material, such as a ceramic or the like. This secondary power substrate 812 made be soldered, sintered, or epoxied to the power substrate 630, while the power contact 614 may be soldered or welded to the upper metal pad on the secondary substrate. A benefit of this approach is the improved heat transfer of the center power contact 614, as the secondary power substrate 812 is highly conductive and would facilitate heat removal from the power contact 614 to a cold plate or heat sink.

FIG. 16C illustrates another aspect of the isolation of the V− terminal 614. In this regard, a thick film isolation 814 may be utilized. The thick film isolation 814 may utilize a printed thick film dielectric directly on the power substrate 630 and may provide voltage blocking. The center contact 614 may be attached to the thick film isolation 814 through an epoxy, directly soldered to a thin layer of metal thick film printed on top of the dielectric film, or the like.

In other aspects, the isolation of the V− terminal 614 may include suspension isolation (not shown). In this aspect, the central power contact 614 may be suspended a sufficient distance over the power substrate 630 and attached to the housing sidewalls 612 in a similar manner to the embedded approach. In this regard, gel encapsulation filling the power module 100 may provide dielectric isolation. The center contact 614 may need to utilize a high stiffness material, however, to not hinder the formation of power wire bonds 628 between the low side devices and the contact.

Figure 17:
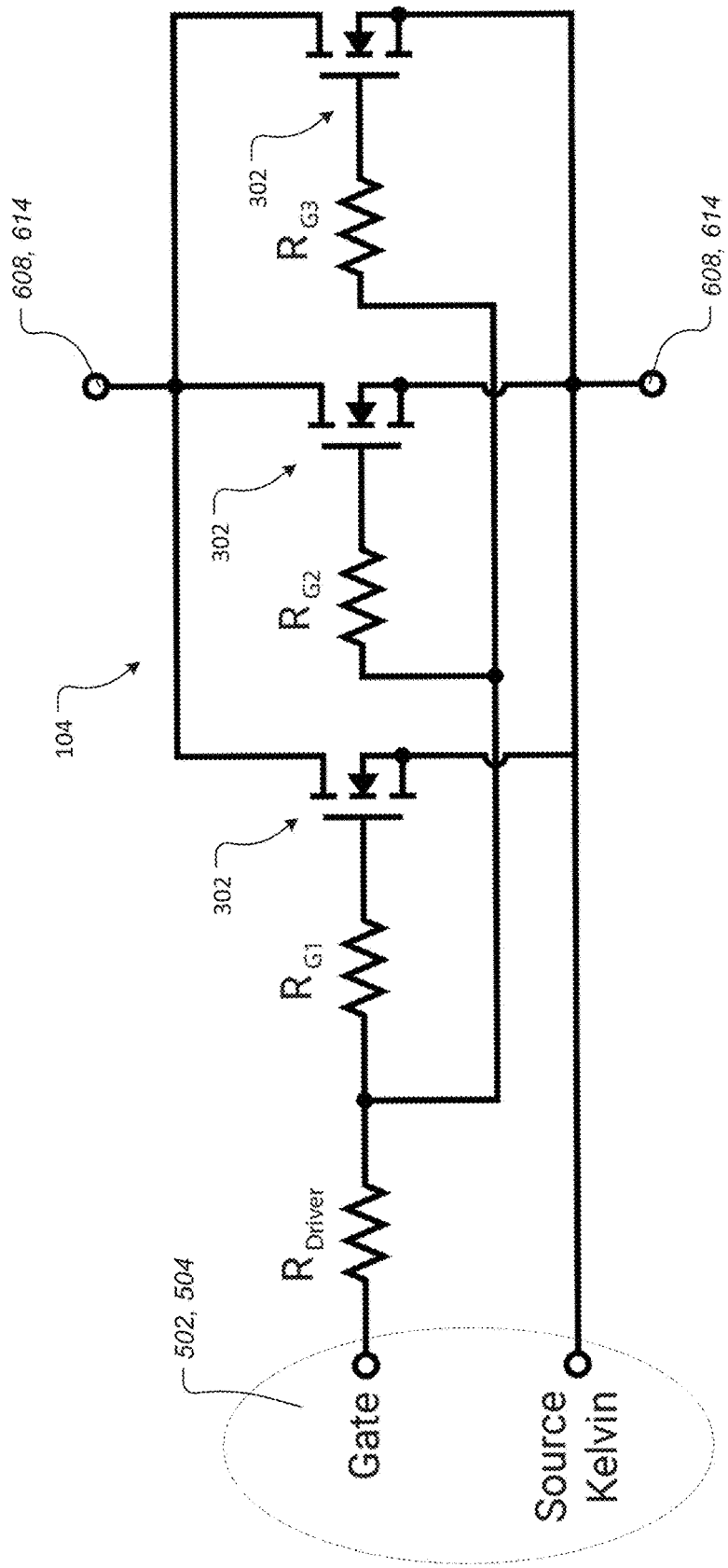
FIG. 17 schematically illustrates a plurality of devices in parallel according to aspects of the disclosure.

FIG. 17 schematically illustrates a plurality of devices in parallel according to aspects of the disclosure. In particular, FIG. 17 shows three power devices 302. This is merely exemplary and for ease of illustration and understanding. The power module 100 of the disclosure may include any number of power devices 302.

The gate control and sense signals factor prominently into switching performance of the power module 100 and may be of particular importance in a paralleled switch position 104. The signal loops may be optimized in the power module 100 for high performance, robustness, and uniform current sharing. Similar to the power loops, the paths may be configured to be limited in length, wide in cross section, and the associated external components may be placed as physically close as possible to the signal terminals 502, 504.

For a paralleled array of power devices 302 such as transistors, particularly MOSFETs, the timing and magnitude of the gate currents must be balanced to result in consistent turn-on and turn-off conditions. The power module 100 may utilize individual ballasting resistors RG1, RG2, RG3 that may be placed in close proximity to the gate of the power devices 302, only separated by the gate wire bond. These components are of a low resistance and aid in buffering a current flowing to each individual power device 302. These components act to decouple the gates of the power devices 302, preventing oscillations and helping to ensure an equalized turn on signal for the paralleled power devices 302. A singular external resistor RDRIVER may be utilized and connected to these paralleled resistors RG1, RG2, RG3 for controlling the turn on speed of the effective switch position 104.

The gate resistors RG1, RG2, RG3 may be a surface mount package, an integrated thick film layer, printed thick film, a wire bondable chip, or the like depending on the application.

Figure 18:
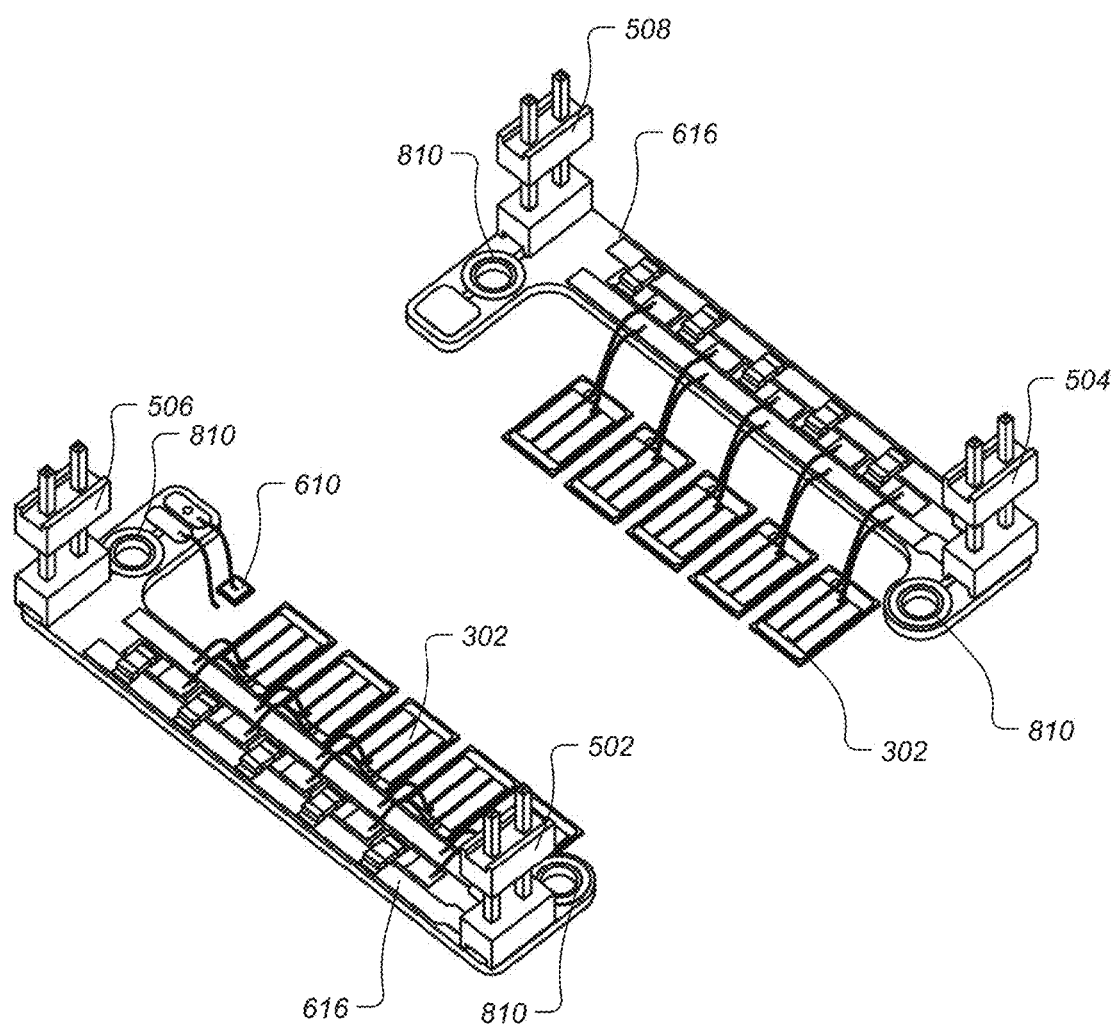
FIG. 18 illustrates a perspective view of the effective gate switching loop according to an aspect of the disclosure.
Figure 19:
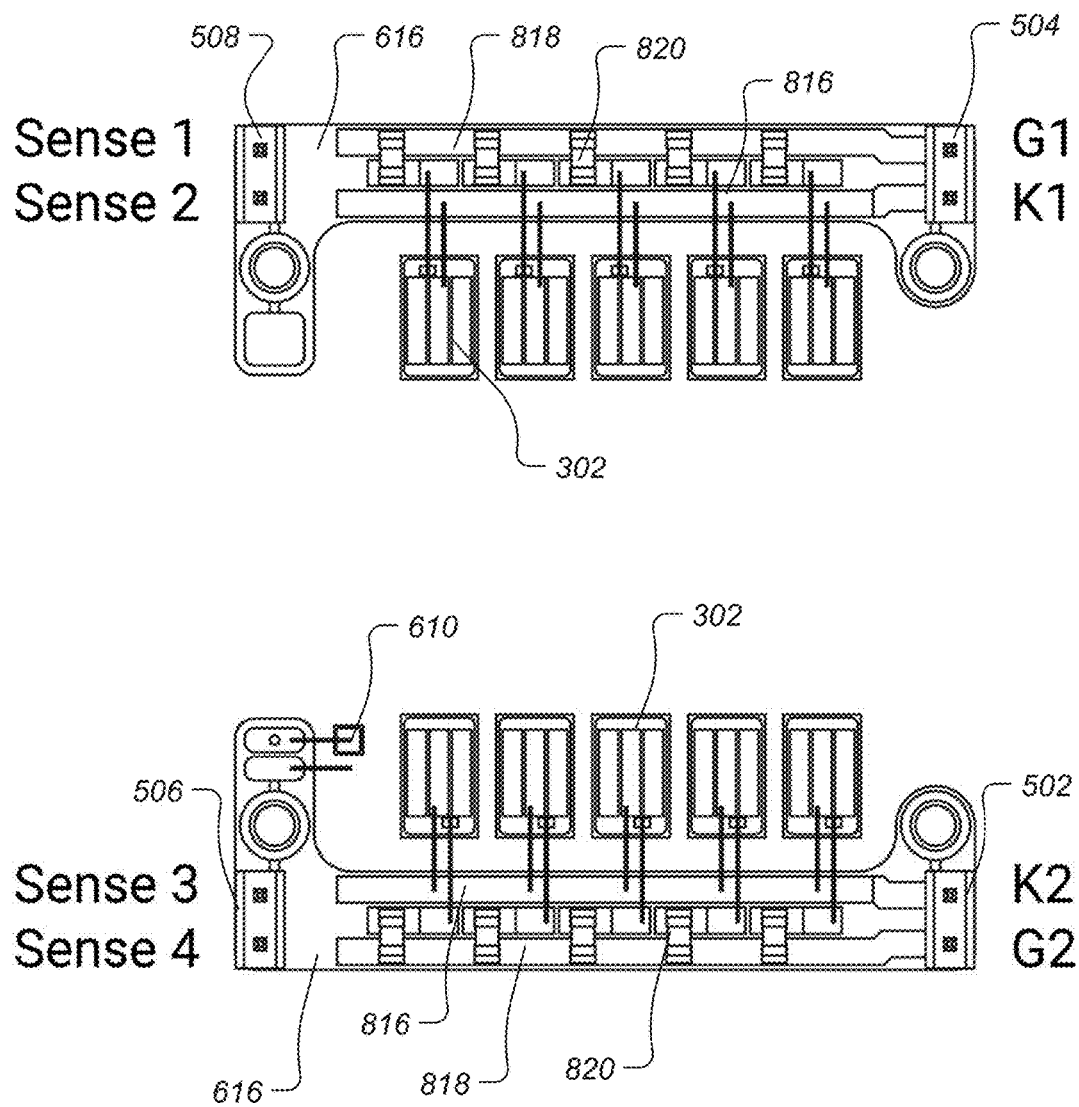
FIG. 19 illustrates a top view of the effective gate switching loop according to an aspect of the disclosure.

FIG. 18 illustrates a perspective view of the effective gate switching loop according to an aspect of the disclosure; and FIG. 19 illustrates a top view of the effective gate switching loop according to an aspect of the disclosure. The signal substrate or signal interconnection assembly 616 may have rails 816, 818 connecting to the gate and source kelvin connector terminals 502, 504 on the edge of the board of the signal interconnection assembly 616. The upper rail 818 may connect to gate wire bond pads through individual resistors 820, while the lower rail 816 may directly wire bond to the source pad of the power device 302. This may be considered a true kelvin connection, as the source kelvin bond is not in the current path of the power source bonds. A kelvin connection may be important for clean and efficient control, reducing the influence of the high drain to source current on the signal loop.

FIG. 18 and FIG. 19 further illustrate optional signal connections 506, 508 on the left hand side of the signal interconnection assembly 616. These connections may be used for temperature measurement or other forms of internal sensing. In some aspects, the internal sensing may include diagnostic sensing that includes diagnostic signals that may be generated from diagnostic sensors that may include strain gauges sensing vibration, sensors sensing humidity, and the like. Moreover, the diagnostic sensors may sense any environmental or device characteristic. In one aspect, the temperature sensor 610 may be placed on the low side position. Of course other locations and arrangements for the temperature sensor 610 are contemplated as well. In one aspect, a wire bond may be placed on the upper pad next to the drain trace (e.g., next to a power device 302) for overcurrent measurement (also referred to as desaturation protection in the case of IGBTs). Of course other locations and arrangements for overcurrent measurement are contemplated as well. In some aspects, an overcurrent sensor or desaturation sensor may sense the voltage drop as determined by connections to the drain of the power devices 302. In some aspects, current can also be sensed by voltage drop across the power devices 302.

This implementation of this signal loop or the signal interconnection assembly 616 may ensure quality control and measurements across any combination of paralleled power devices 302 in the switch position 104. Standard PCB board-to-board connectors may allow for a straightforward connection to external gate driver and control circuitry.

This gate distribution network, as shown, may be implemented with a PCB. It may also be formed as a thick film circuit directly on the primary power substrate 630, directly on the base plate 602, or the like. This has the benefit of reducing the part count of the power module 100 as well as the option to print the gate resistors 820. The gate resistors 820 may be much smaller than the size of the surface mount parts on a PCB, as there may be no need for solder terminals and the gate resistors 820 may be actively cooled from the cold plate, minimizing thermal sizing constraints of the component.

Figure 20:
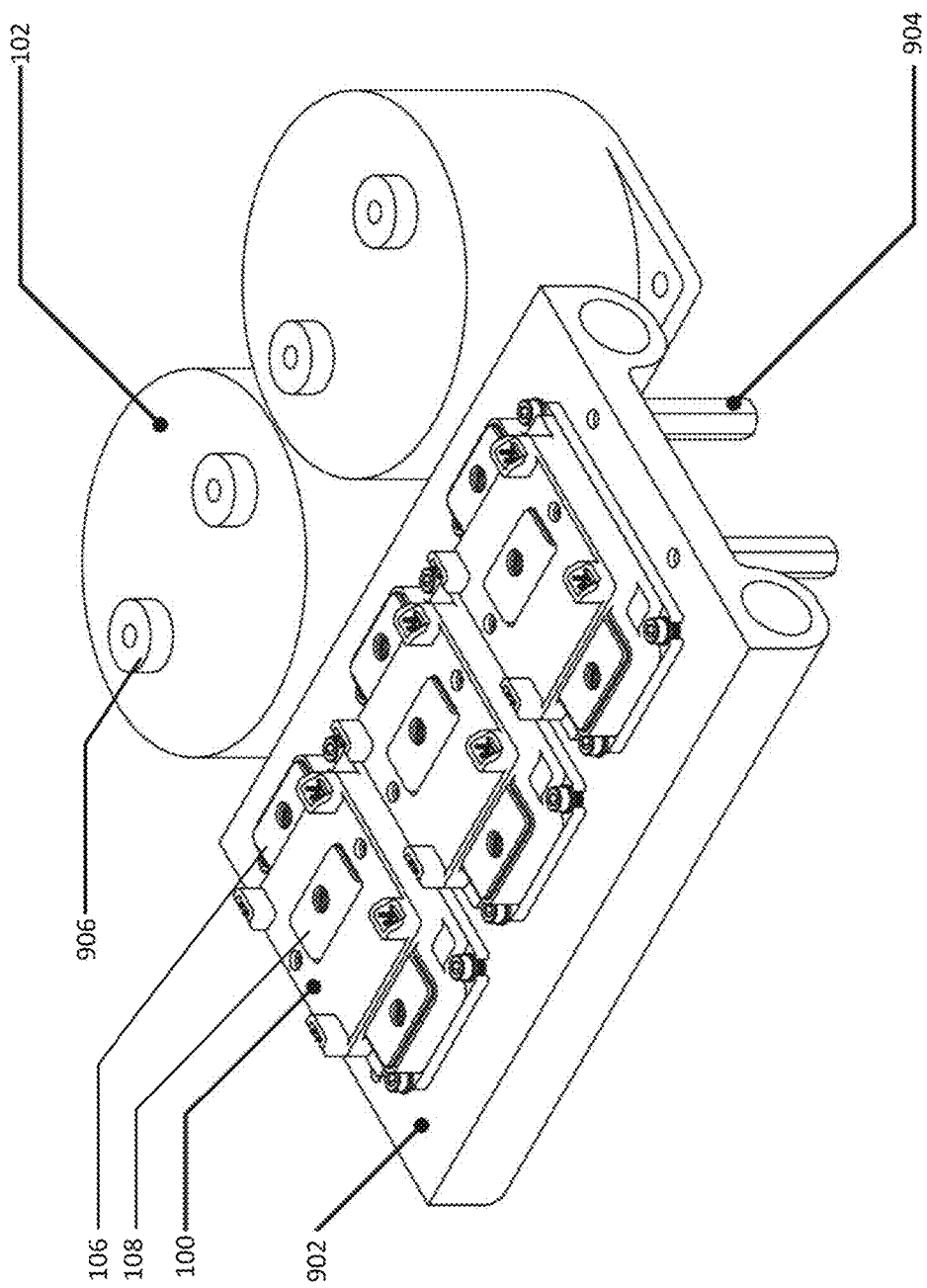
FIG. 20 illustrates a partial exemplary implementation that includes a power module according to aspects of the disclosure.

FIG. 20 illustrates a partial exemplary implementation that includes a power module according to aspects of the disclosure. In this regard, FIG. 20 is a representative exemplary structure implementing the power module 100 of the disclosure in a high performance system. This general approach applies to many other configurations and topologies, serving as a useful example of how to utilize the power module 100 in a converter. This specific example is for a three phase motor drive. In this aspect, there are three power modules 100.

The disclosed power modules 100 may be configured in an array of half-bridge phase legs (three, as illustrated). Additional power modules 100 may be included in parallel to increase the current as needed for the application.

The FIG. 20 implementation may further include a cold plate 902. The cold plate 902 may be high performance liquid cold plate, heat sink, or the like, serving to transfer waste heat away from the power modules 100 to another source (liquid, air, etc.).

The FIG. 20 implementation may further include the DC link capacitors 102. The DC link capacitors 102 may be implemented as filtering capacitors interfacing a source of DC power and the power module 100. In one aspect, the DC link capacitors 102 may be implemented as a single capacitor. In another aspect, the DC link capacitors 102 may be implemented as multiple components forming a 'bank' of capacitors, depending on the power demands of the load and/or the particular application.

The FIG. 20 implementation may further include cold plate standoffs 904. The cold plate standoffs 904 may provide structural support to the cold plate 902. The cold plate standoffs 904 may be configured as shown, elevating and placing the power module 100 terminals 106, 108 in-plane with capacitor contacts 906. In this aspect, flat buss bars with no bends can interconnect the components. For higher power density or for different types of capacitors, the height of the cold plate standoffs 904 may be adjusted to best utilize the form factor available for the elements of the converter. This may have a corresponding tradeoff of increasing the electrical loop length as transition bends could be necessary, and will depend on system specific requirements.

Figure 21:
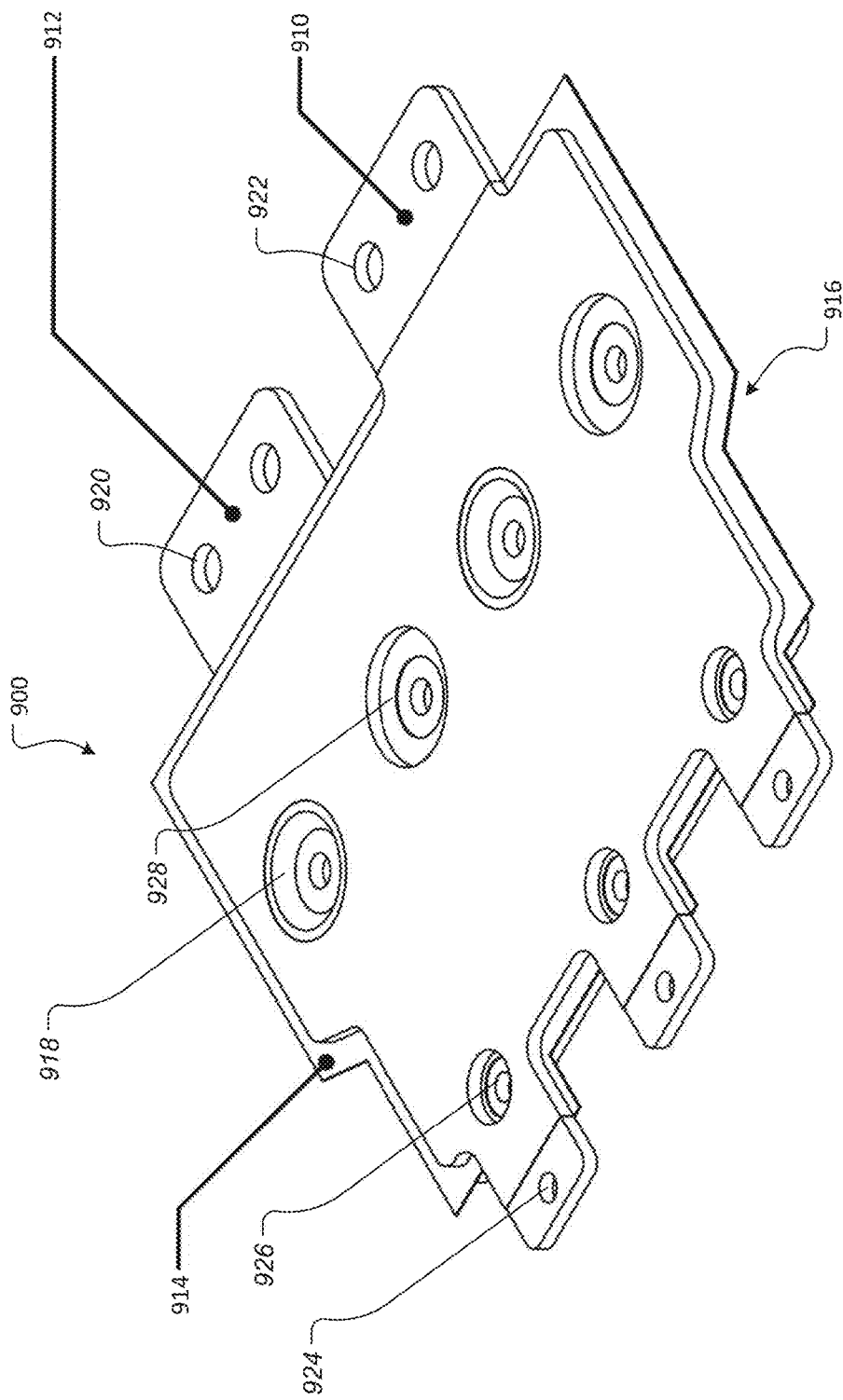
FIG. 21 illustrates an exemplary laminated buss bar according to the disclosure.
Figure 22:
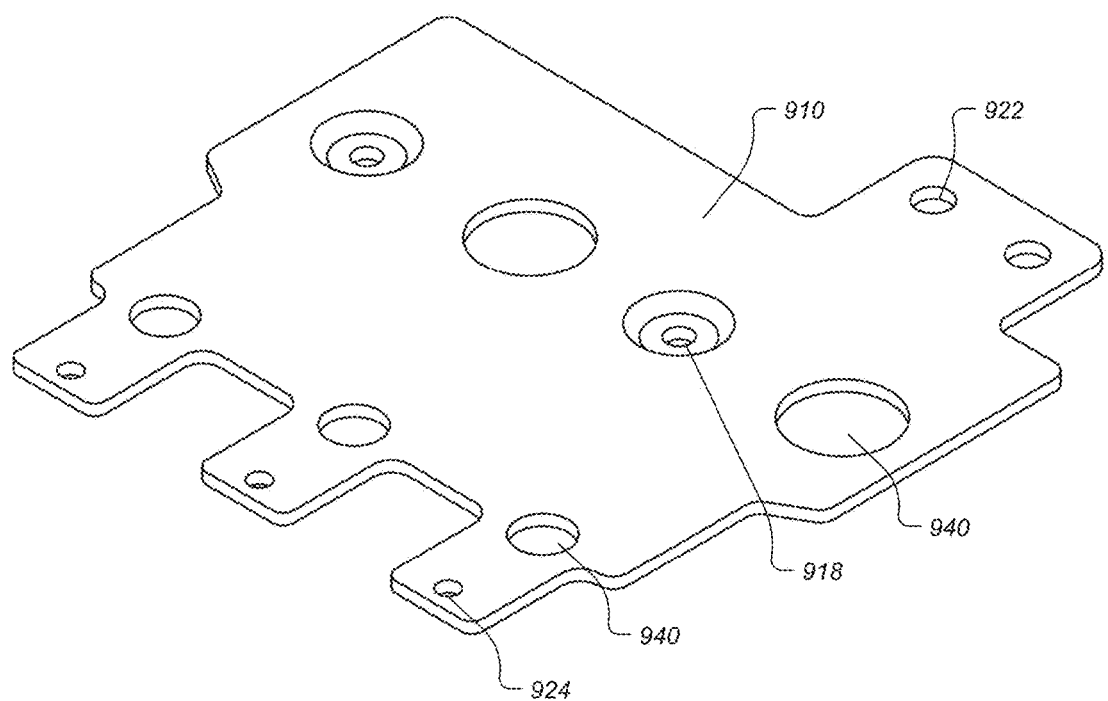
FIG. 22 illustrates one portion of the exemplary laminated buss bar according to FIG. 21.
Figure 23:
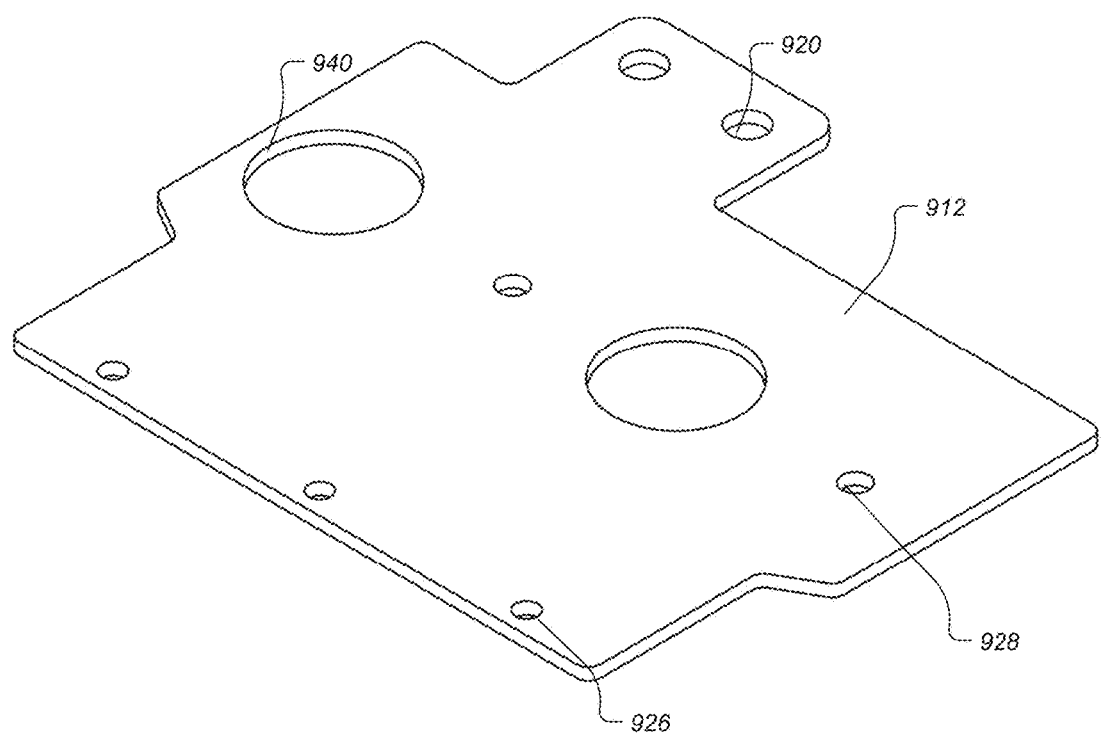
FIG. 23 illustrates another portion of the exemplary laminated buss bar according to FIG. 21.

FIG. 21 illustrates an exemplary laminated buss bar according to the disclosure; FIG. 22 illustrates one portion of the exemplary laminated buss bar according to FIG. 21; and FIG. 23 illustrates another portion of the exemplary laminated buss bar according to FIG. 21. The power terminal layout may be designed to facilitate simple and effective buss bar interconnection. To minimize inductance between the DC link capacitors 102 and the terminals 106, 108 of the power module 100, buss bars 900 may have thick conductors 910, 912 and the thick conductors 910, 912 of the buss bars 900 may overlap. The thick conductors 910, 912 may be separated by a thin dielectric film 914. Current travels through each sheet of the thick conductors 910, 912 in opposing directions, acting to greatly reduce the effective inductance between the power devices 302 and the filtering DC link capacitors 102. The upper layers of the thick conductor 910 may be embossed to form co-planar contacts 918 at the mating surface to the DC link capacitors 102 eliminating the need for washers or spacers, which can interfere with electrical performance.

An example laminated buss bar 900, matching the system level layout presented above may include one or more of a conductor V+ plane 912, a conductor V− plane 910, and a dielectric film 914.

The conductor V+ plane 912 may connect the V+ terminal 106 of the power module 100 through contacts 926 to the V+ terminal of the DC link capacitor(s) 102 through contacts 928, as well as having terminals 920 for external connection.

The conductor V− plane 910 may connect the V− terminal 108 of the power module 100 through contacts 924 to the V− terminal of the DC link capacitor(s) 102 through contacts 918, as well as having terminals for external connection 922. The contacts 918, 924, 926, 928 and the terminals 920, 922 may each be implemented with a fastener aperture configured to receive a fastener to form an electrical connection. Other electrical connection implementations are contemplated as well. The conductors 910, 912 may include apertures 940. The apertures 940 in one of the conductors 910, 912 allow for access to the contacts in another one of the conductors 910, 912.

The dielectric film 914 may be implemented as a thin electrical insulator placed between the overlapping metal layers of the conductors 910, 912. The dielectric film 914 may provide dielectric insulation according to electrical safety standards. The dielectric film 914 may be kept as thin as possible to minimize inductance. A film may also cover the tops and bottoms of the laminated buss bar 900 in all areas that do not require an electrical connection. The edges 916 of the laminated buss bar 900 may be sealed through a variety of methods, including a pinch seal lamination, epoxy seal, a dielectric insert, or the like, depending on geometry and available space. In some aspects, the dielectric film 914 material may be adhered to the laminated buss bar 900 with an acrylic adhesive. In some aspects, the laminated buss bar 900 may include a pinch seal with a polymer material. In some aspects, the laminated buss bar 900 may be subsequently subjected to pressure, heat, and time to form the laminate.

In some aspects, the buss bar 900 and the conductors 910, 912 have a generally planar construction. More specifically, the buss bar 900 may have a generally flat upper surface and a generally flat lower surface as shown in FIG. 15. In some aspects, the thickness of one of the conductors 910, 912 along with the dielectric film 914 defines the offset distance 702 illustrated in FIG. 13. In one aspect, the thickness of one of the conductors 910, 912 along with the dielectric film 914 may be 0.5 mm to 10 mm, which corresponds to the offset distance 702. In one aspect, the thickness of one of the conductors 910, 912 along with the dielectric film 914 may be 1 mm to 2 mm, which corresponds to the offset distance 702. In one aspect, the thickness of one of the conductors 910, 912 along with the dielectric film 914 may be 0.5 mm to 1 mm, which corresponds to the offset distance 702. In one aspect, the thickness of one of the conductors 910, 912 along with the dielectric film 914 may be 2 mm to 3 mm, which corresponds to the offset distance 702. In one aspect, the thickness of one of the conductors 910, 912 along with the dielectric film 914 may be 3 mm to 4 mm, which corresponds to the offset distance 702. In one aspect, the thickness of one of the conductors 910, 912 along with the dielectric film 914 may be 4 mm to 5 mm, which corresponds to the offset distance 702. In one aspect, the thickness of one of the conductors 910, 912 along with the dielectric film 914 may be 5 mm to 6 mm, which corresponds to the offset distance 702. In one aspect, the thickness of one of the conductors 910, 912 along with the dielectric film 914 may be 6 mm to 7 mm, which corresponds to the offset distance 702. In one aspect, the thickness of one of the conductors 910, 912 along with the dielectric film 914 may be 7 mm to 8 mm, which corresponds to the offset distance 702. In one aspect, the thickness of one of the conductors 910, 912 along with the dielectric film 914 may be 8 mm to 9 mm, which corresponds to the offset distance 702. In one aspect, the thickness of one of the conductors 910, 912 along with the dielectric film 914 may be 9 mm to 10 mm, which corresponds to the offset distance 702.

Figure 24:
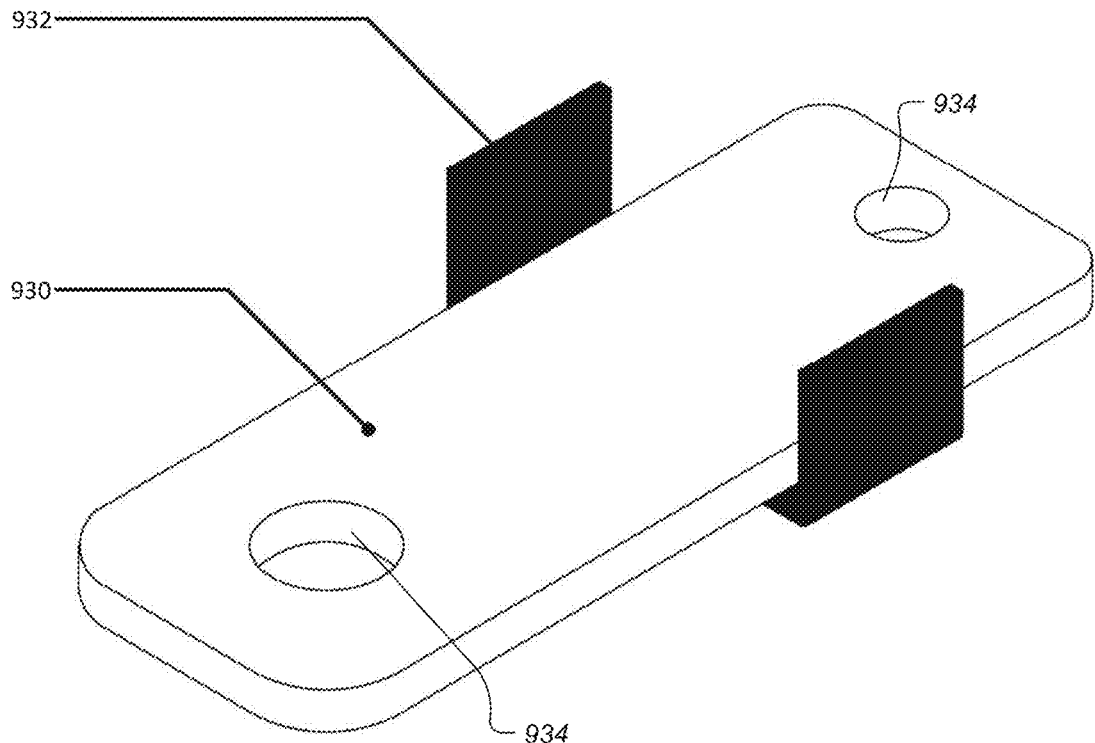
FIG. 24 illustrates a phase output buss bar according to the disclosure.

FIG. 24 illustrates a phase output buss bar according to the disclosure. For a three phase motor drive, as in this example, the phase outputs 930 may not require lamination or overlapping to minimize inductance. This is due to the fact that the phase output buss bars 930 are driving inductive loads, which limits the need to reduce inductance on the output paths. Accordingly, the phase output buss bars 930 may be standalone elements and may be much less complex than the laminated DC link structure. The phase output buss bars 930 may include apertures 934 for receiving a fastener to form an electrical connection.

It is highly desirable to measure the output current from each phase. This can be performed through a number of methods, such as adding in a low resistance series resistor (called a shunt) and measuring the voltage drop across it, including a sensor that measures the magnetic field generated by the current and providing a proportional signal to a controller, or the like. FIG. 24 illustrates one of the output buss bars 930 for this system as well as a configuration to improve measurement accuracy by adding a ferrous shield 932 to focus the magnetic field in a region where the sensor may be located.

The phase output buss bar 930 or conductor may be configured to provide transitions from the phase output terminal 110 of each power module 100 to an external terminal connection. The form and arrangement of the phase output buss bar 930 or conductor may vary and depend on the specific topology or arrangement of the power modules 100.

The ferrous shield 932 or magnetic field concentrator may be configured to focus the magnetic field generated by current flow in a target region where a sensor may be placed. This may not be required for operation but is a highly advantageous arrangement to extract output current measurements in most converter systems.

Figure 25:
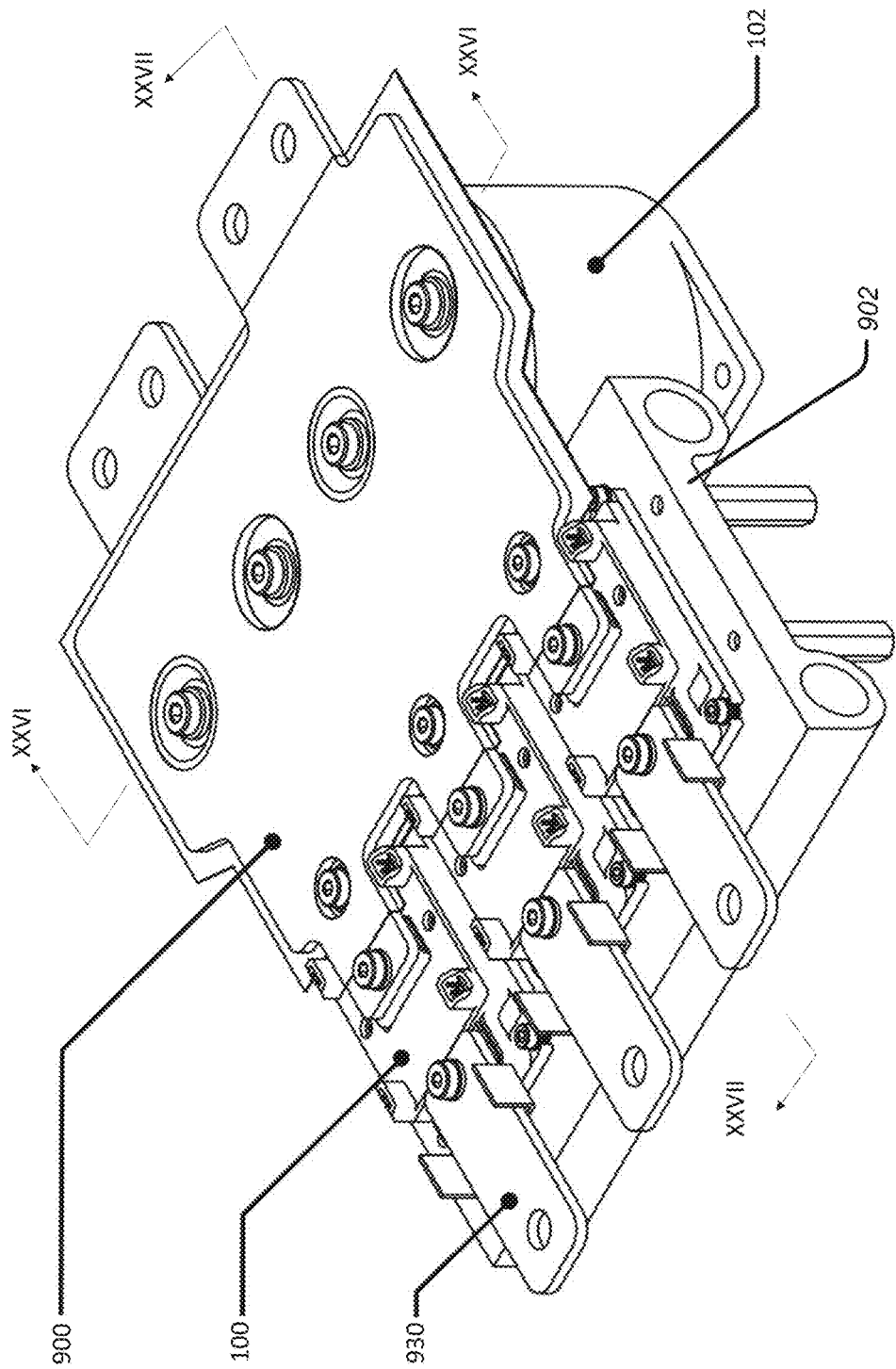
FIG. 25 illustrates a perspective view an exemplary implementation that includes a power module and laminated buss bar according to aspects of the disclosure.
Figure 26:
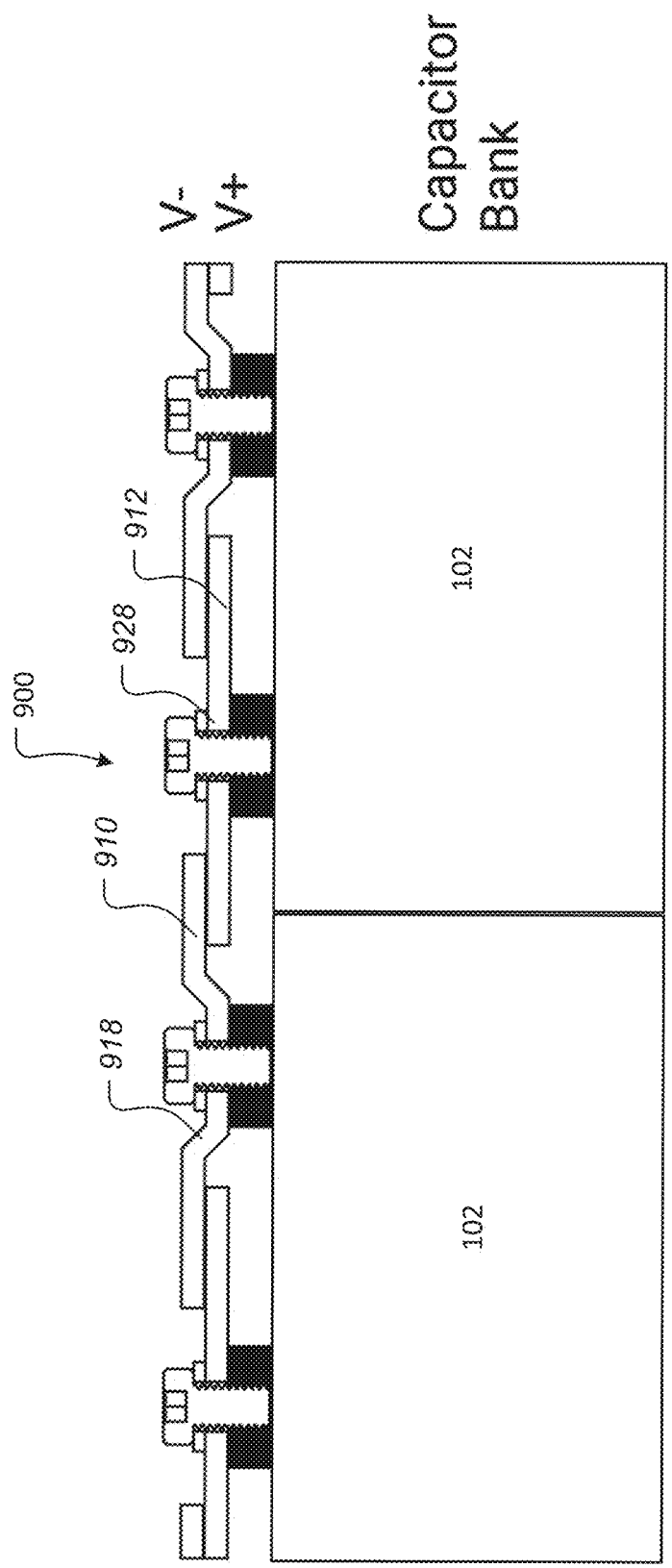
FIG. 26 illustrates a first cross-sectional view of an exemplary implementation that includes a power module and laminated buss bar according to FIG. 25.
Figure 27:
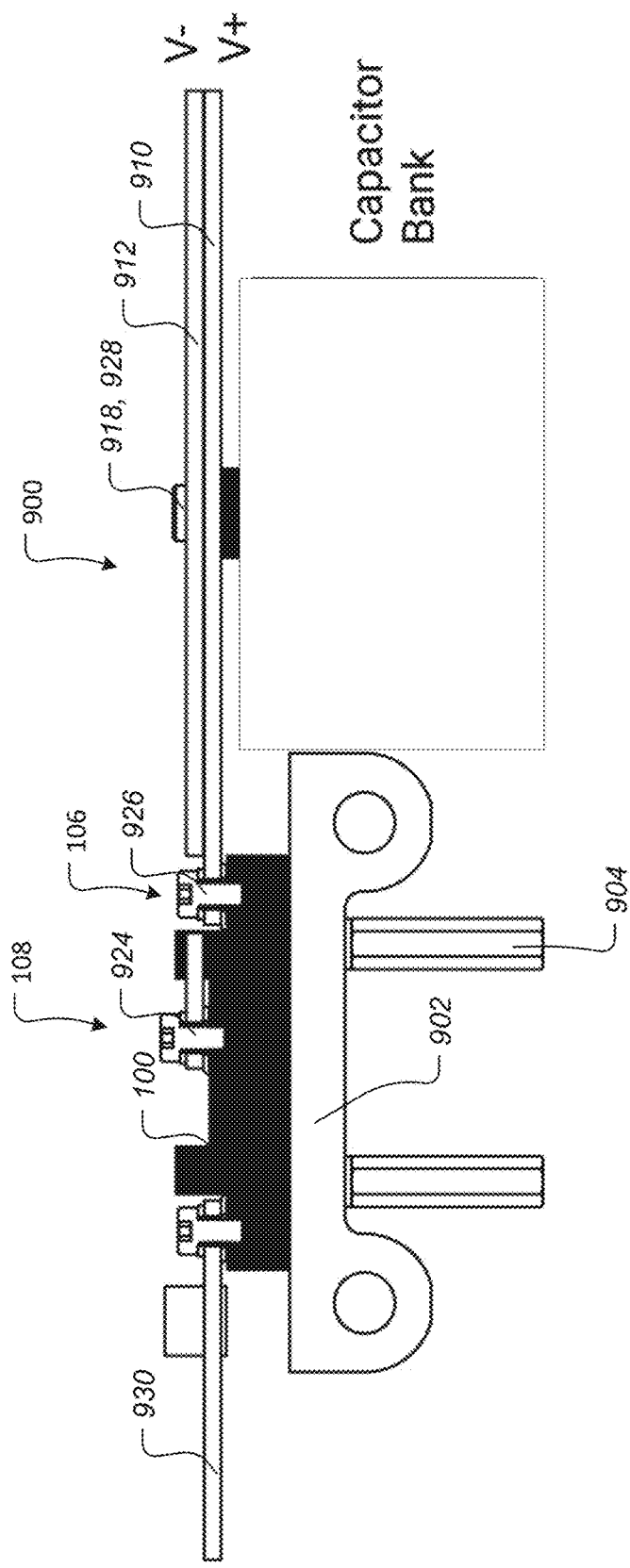
FIG. 27 illustrates a second cross-sectional view of an exemplary implementation that includes a power module and laminated buss bar according to FIG. 25.

FIG. 25 illustrates a perspective view an exemplary implementation that includes a power module and laminated buss bar according to aspects of the disclosure; FIG. 26 illustrates a first cross-sectional view of an exemplary implementation that includes a power module and laminated buss bar according to FIG. 25; and FIG. 27 illustrates a second cross-sectional view of an exemplary implementation that includes a power module and laminated buss bar according to FIG. 25. FIGS. 25-27 illustrate the motor drive system layout with the laminated buss bar 900 structures described above. As shown in FIGS. 25-27, the system may include the power module 100 array, cold plate 902 assembly, the DC link capacitor 102, the DC link laminated buss bar 900 assembly, and the output contact buss bars 930.

A cross-section of the terminals of the DC link capacitors is illustrated in FIG. 26. FIG. 26 illustrates the embossed co-planar connections 918 featured in the buss bars 900, as well as the high degree of metal lamination in every feasible location. The only separation between the plates 910, 912 may be the minimum area required for the sheet metal fabrication processes (emboss tools, work holding, tolerances, etc.) and for dielectric isolation 914 (edge seals, creepage, clearance).

The cross section across the power module 100 shown in FIG. 27 illustrates the optimized overlapping critical loop from the bank of the DC link capacitors 102 to the terminals 106, 108 of the power module 100. This reinforces the concept discussed in FIG. 15 with actual representative components and physical design restraints.

In all, this low inductance, high current interconnection structure may be necessary for and enabled by the disclosed power module design. Together, they form an effective and highly integrated low inductance path between the bank of the DC link capacitors 102 and the switch positions 104. This structure allows for efficient, stable, and very high frequency switching of the power devices 302 such as wide band gap semiconductors.

Figure 28:
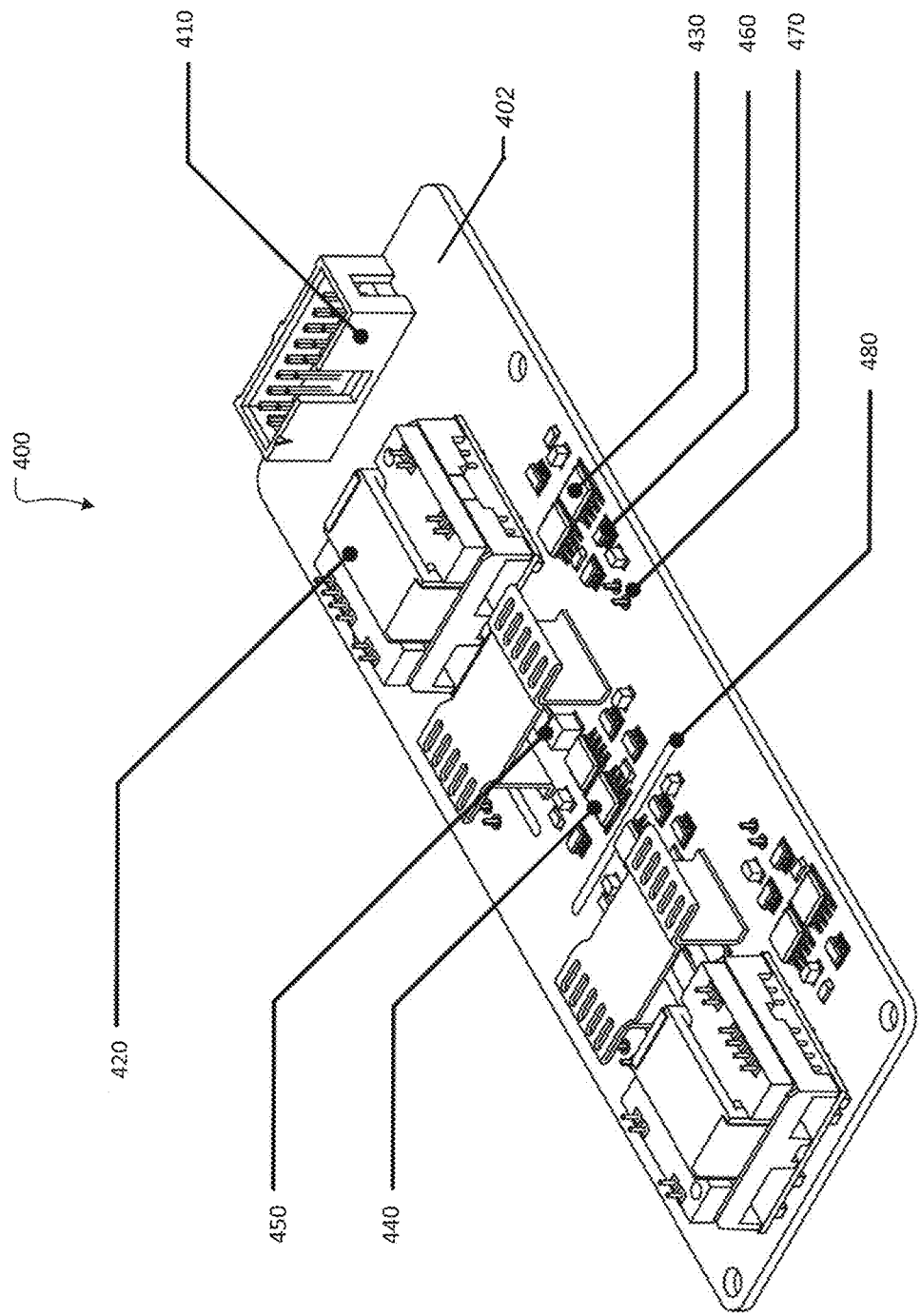
FIG. 28 and FIG. 29 illustrate an exemplary single module gate driver according to the disclosure.

FIG. 28 illustrates an exemplary single module gate driver according to the disclosure. The gate driver acts as a power amplifier delivering drive current to the switch positions 104 while providing voltage isolation between a controller and high voltage power stages. Isolation may also be maintained between driver blocks between switch positions 104. For high frequency switching, the output stage of the drivers may be physically located close to the switch positions 104.

Additional features may be included for safety, such as under voltage, over voltage, and over current protection. A gate driver circuit may be configured to ensure the power module 100 is always functioning in a safe operating region and will shut down carefully in the event of a failure.

With this power module design, the gate drivers may be seated directly above the laminated power bussing 900. They may be formed as a single PCB and racked up or scaled in the same modular fashion as the power modules 100. Alternatively, the drivers may also be integrated on a single PCB across an array of power modules 100, saving size but increasing complexity due to the multiple high voltage nodes on the board. The output stage of the drivers may be located directly next to the board to board connector making contact with the module signal pins.

An example single module gate driver 400 is presented in FIG. 28. The single module gate driver 400 elements may be duplicated for each switch position 104. The arrangement and specific layout of each block may be system dependent and are configured in this drawing as a generalized example.

The single module gate driver 400 elements may include one or more of control signal connector 410, isolated power supply 420, signal isolation and conditioning component 430, amplifier stage 440, bulk gate resistor and local current filter 450, sensors and protection components 460, power module signal connector 470, and creepage extension slots 480. The single module gate driver 400 may be arranged on a printed circuit board (PCB 402).

The control signal connector 410 may be configured to interface the controller and the gate driver such that the differential control and sensor signals may be transferred between the two through a cable, board to board connector, or similar mechanism.

The isolated power supply 420 may be implemented as a DC-DC converter providing the required positive and negative voltages for turn-on and turn-off of the power devices 302. The isolated power supply 420 may be high enough power to source the current needed by the power devices 302. Isolation between the control and power stages may be a vital function of this block.

The signal isolation and conditioning component 430 may include circuitry to provide isolation of the control signals between the low voltage control and the high voltage power, as well as conditioning the control signals for the amplifier stage 440 of the driver.

The amplifier stage 440 may be formed of discrete or integrated components. The amplifier stage 440 may transform the isolated low power control signals into the currents and voltages required by the switch position 104 to operate. This should be as physically close to the module signal terminals as possible for clean switching.

The bulk gate resistor and local current filter 450 may be the final stage before transition to the output pins, the bulk gate resistor and local current filter 450 and may be used to tune the turn-on and turn-off times of the switch position 104 to match the needs of a particular system. These may be a single set of passive elements, or as part of a network with different resistance values for turn-on and turn-off if different switching characteristics are desired. A local filter may also be used to ensure a quality source of current is maintained during switching events.

The sensors and protection components 460 may include circuitry, which may include under and over voltage protections, over current protections, temperature sensing, and mechanisms for a safe shut down in the event of a failure.

The power module signal connector 470 may be located on the underside of the PCB 402. The power module signal connector 470 may interface the gate driver and the power module 100, providing a direct connection to the gate distribution network internal to the power module 100. This may be typically facilitated with a board to board connector, a direct solder connection, or the like. A wire to board connection is also possible, but may need the driver to be physically close to the power module 100.

The creepage extension slots 480 may be configured to improve voltage isolation between driver stages, allowing for a more compact packing of the components. Voltage isolation is an increasing challenge as the size of high voltage power modules continues to shrink. Cutting a slot in the PCB 402 may be one option to increase the voltage creepage distance without adding board size. Other options include local potting of critical nodes and fully covering the entire assembly with a conformal dielectric coating. More specifically, the various components of the power module 100 including the PCB 402 may include discrete and/or local potting of one or more components; and the various components of the power module 100 including the PCB 402 may include conformal dielectric coating on one or more components, the entire PCB 402, and/or other assemblies of the power module 100.

Figure 29:
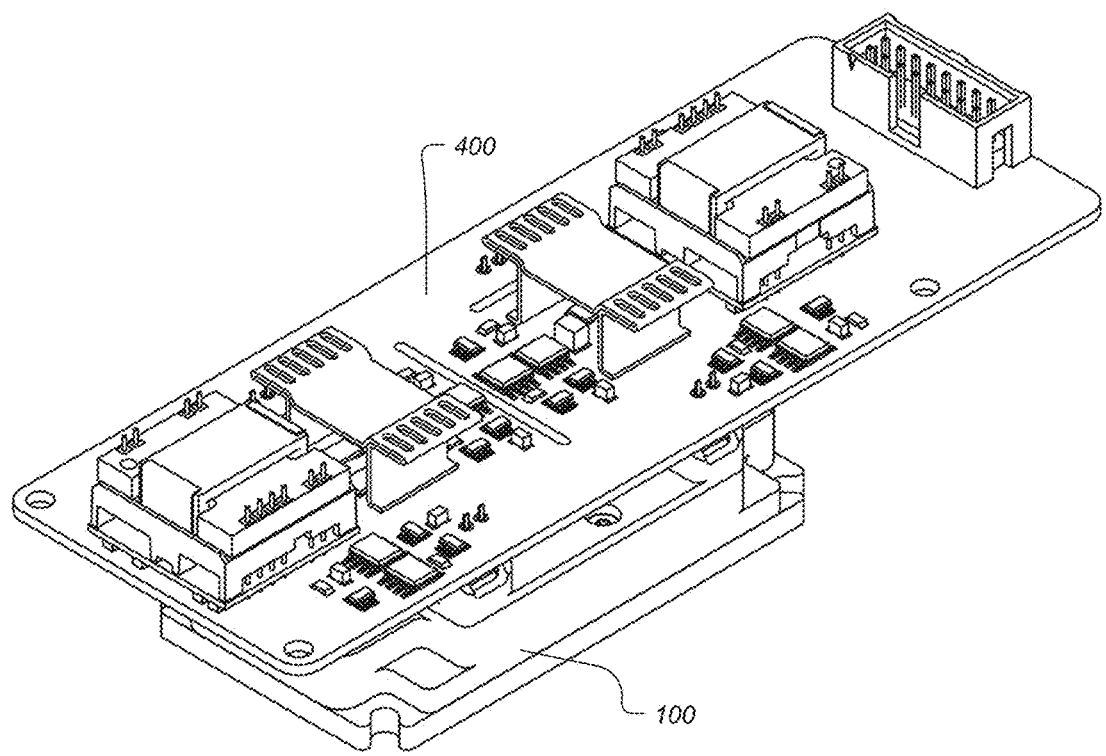

When integrated together as shown in FIG. 29, the gate driver 400 and power module 100 form a compact single unit with an optimized low inductance signal flow from the control source, through isolation, amplified, and then distributed through the gate resistor network directly to the gates of the paralleled power devices 302.

Figure 30:
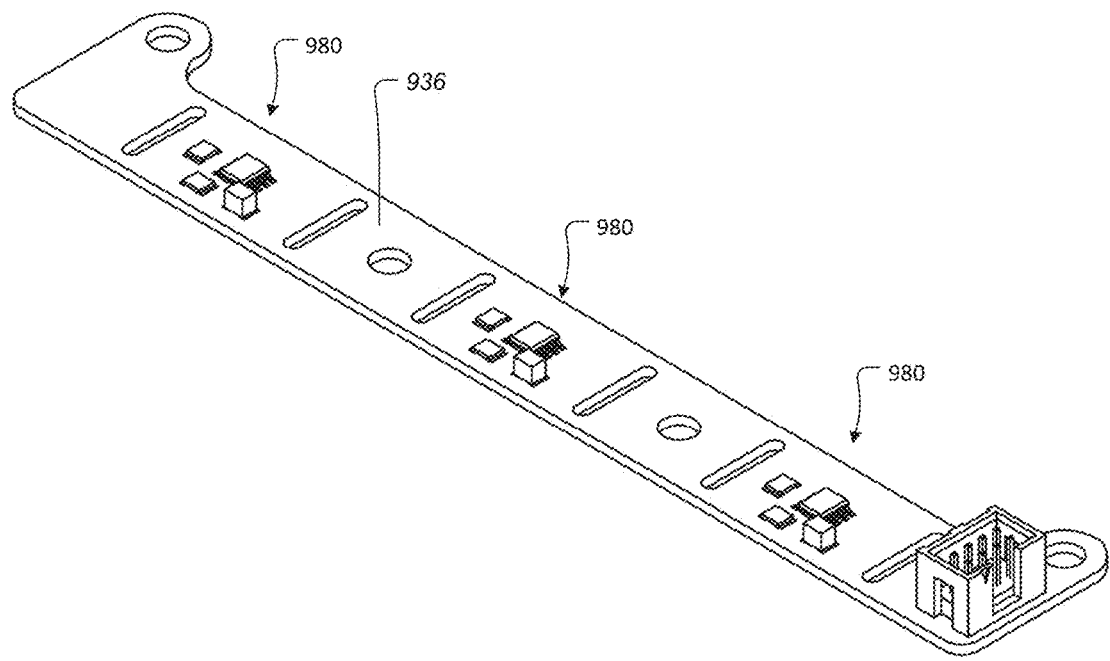
FIG. 30 illustrates a current sensing component according to aspects of the disclosure.
Figure 31:
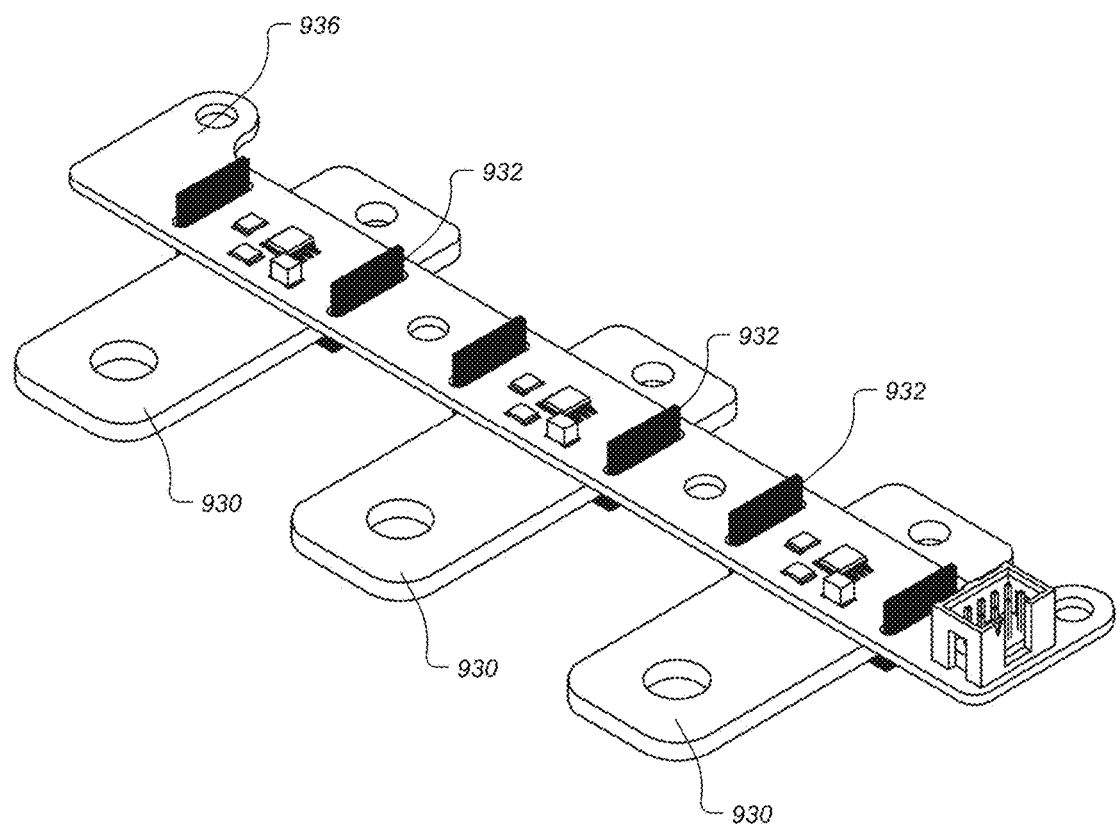
FIG. 31 illustrates a current sensing component arranged with phase output buss bars according to FIG. 30.

FIG. 30 illustrates a current sensing component according to aspects of the disclosure; and FIG. 31 illustrates a current sensing component arranged with phase output buss bars according to FIG. 30. There are multiple methods to sense current. In one aspect of the disclosure illustrated in FIGS. 30 and 31, a non-contact magnetic sensor 980 may be utilized. The non-contact magnetic sensors 980 may be utilized with a ferrous shield 932 to focus the magnetic field. The non-contact magnetic sensors 980 may utilize a small sensor chip placed in this region which produces a proportional signal to the output current. An example of the sensors on a single PCB 936 for all three phases is illustrated in FIG. 30, and the full output buss bar structure with the magnetic shields is illustrated in FIG. 31.

Figure 32:
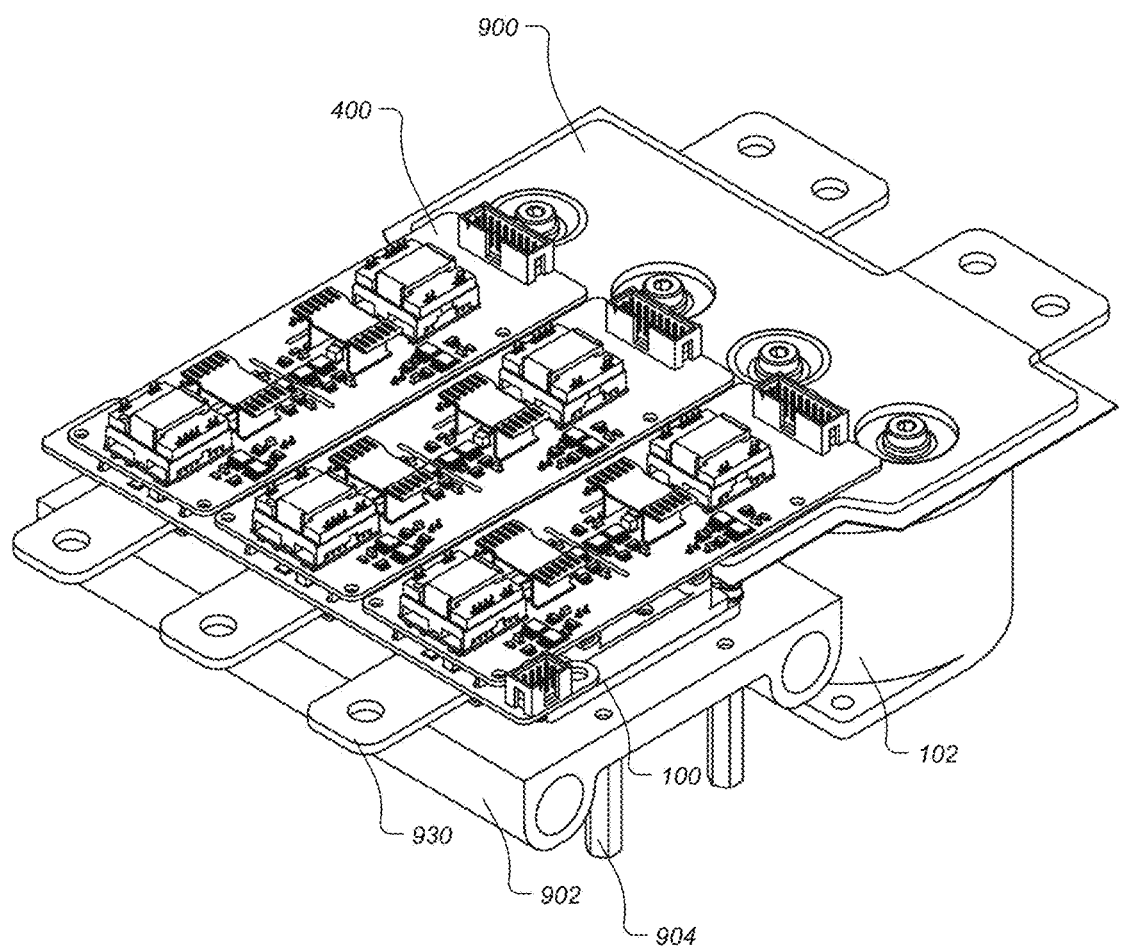
FIG. 32 illustrates an exemplary three phase motor drive power according to an aspect of the disclosure.

FIG. 32 illustrates an exemplary three phase motor drive power stack-up according to an aspect of the disclosure. In particular, FIG. 32 illustrates an exemplary three phase motor drive power stack-up with all of functional components described previously. The FIG. 32 system is highly integrated and heavily optimized for peak electrical performance. Additional features such as voltage sensing of the capacitor bank and EMI shielding enclosures are contemplated and would integrate well within this high performance core.

This exemplary approach is adaptable for most systems within the power processing needs and size and weight restrictions specific for a given application. The power module design and system level structures described in the disclosure allow for a high level of power density and volumetric utilization to be achieved.

Accordingly, the disclosure has set forth an improved power module 100 and associated system configured to address parasitic impedances, such as loop inductance, to increase stability, decrease switching losses, reduce EMI, and limit stresses on system components. In particular, the disclosed power module has the ability with the disclosed arrangement to reduce inductance in some aspects by as much as 10%. Moreover, the disclosed power module 100 may be implemented in numerous typologies including a half-bridge configuration, a full-bridge configuration, a common source configuration, a common drain configuration, a neutral point clamp configuration, and a three phase configuration. Applications of the power module 100 include motor drives, solar inverters, circuit breakers, protection circuits, DC-DC converters, and the like.

Aspects of the disclosure have been described above with reference to the accompanying drawings, in which aspects of the disclosure are shown. It will be appreciated, however, that this disclosure may, however, be embodied in many different forms and should not be construed as limited to the aspects set forth above. Rather, these aspects are provided so that this disclosure will be thorough and complete, and will fully convey the scope of the disclosure to those skilled in the art. Like numbers refer to like elements throughout.

It will be understood that, although the terms first, second, etc. are used throughout this specification to describe various elements, these elements should not be limited by these terms. These terms are only used to distinguish one element from another. For example, a first element could be termed a second element, and, similarly, a second element could be termed a first element, without departing from the scope of the disclosure. The term "and/or" includes any and all combinations of one or more of the associated listed items.

The terminology used herein is for the purpose of describing particular aspects only and is not intended to be limiting of the disclosure. As used herein, the singular forms "a," "an" and "the" are intended to include the plural forms as well, unless the context clearly indicates otherwise. It will be further understood that the terms "comprises" "comprising," "includes" and/or "including" when used herein, specify the presence of stated features, integers, steps, operations, elements, and/or components, but do not preclude the presence or addition of one or more other features, integers, steps, operations, elements, components, and/or groups thereof.

It will be understood that when an element such as a layer, region or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "top" or "bottom" may be used herein to describe a relationship of one element, layer or region to another element, layer or region as illustrated in the figures. It will be understood that these terms are intended to encompass different orientations of the device in addition to the orientation depicted in the figures.

Aspects of the disclosure are described herein with reference to cross-section illustrations that are schematic illustrations of idealized embodiments (and intermediate structures) of the disclosure. The thickness of layers and regions in the drawings may be exaggerated for clarity. Additionally, variations from the shapes of the illustrations as a result, for example, of manufacturing techniques and/or tolerances, are to be expected.

In the drawings and specification, there have been disclosed typical aspects of the disclosure and, although specific terms are employed, they are used in a generic and descriptive sense only and not for purposes of limitation, the scope of the disclosure being set forth in the following claims.

While the disclosure has been described in terms of exemplary aspects, those skilled in the art will recognize that the disclosure can be practiced with modifications in the spirit and scope of the appended claims. These examples given above are merely illustrative and are not meant to be an exhaustive list of all possible designs, aspects, applications or modifications of the disclosure. In this regard, the various aspects, features, components, elements, modules, arrangements, circuits, and the like are contemplated to be interchangeable, mixed, matched, combined, and the like. In this regard, the different features of the disclosure are modular and can be mixed and matched with each other.

What is claimed is:

1. A power module, comprising: at least one power substrate; a plurality of power devices electrically connected to the at least one power substrate; the at least one power substrate extending in a width direction and a length direction; a first set of the plurality of power devices arranged in a first row on the at least one power substrate along the width direction; a second set of the plurality of power devices arranged in a second row on the at least one power substrate along the width direction, the first row being positioned at a different position along the length direction of the at least one power substrate then the second row; and a plurality of terminals, each of the plurality of terminals extending in the width direction and the length direction of the at least one power substrate, and each of the plurality of terminals being positioned at a different position along the length direction of the at least one power substrate, wherein the plurality of power devices and plurality of terminals are configured to increase current sharing by the plurality of power devices, wherein a housing arranged on the at least one power substrate; and an isolation structure on and electrically isolated from the at least one power substrate, wherein one of the plurality of terminals is on the isolation structure; and wherein the isolation structure comprises at least one of the following: an embedded isolation component located in the housing, a secondary power substrate arranged on the at least one power substrate, a film isolation component arranged on the at least one power substrate, and a suspension isolation construction located in the housing.

2. The power module of claim 1, wherein current flows in a loop through the power module through a first one of the plurality of terminals, the at least one power substrate, and a second one of the plurality of terminals to reduce inductance.

3. The power module of claim 1 wherein at least one of the plurality of terminals comprise a sheet metal construction.

4. A system comprising the power module of claim 1, wherein:
the power module comprises at least two power modules and the at least two power modules are arranged and configured in parallel;
each of the at least two power modules comprises a first terminal of the plurality of terminals;
the first terminals of the at least two power modules being configured to connect to a first buss bar;
the at least two power modules are arranged in a topology pattern; and
the topology pattern forms at least one of the following: a half-bridge configuration, a full-bridge configuration, a common source configuration, a common drain configuration, a neutral point clamp configuration, and a three phase configuration.

5. The system of claim 4, wherein:
each of the at least two power modules comprises a second terminal of the plurality of terminals; and
the second terminals of the at least two power modules being configured to connect to a second buss bar.

6. The system of claim 5, wherein each of the power modules are configured such that current flows in a loop through the first terminal of the at least two power modules, the at least one power substrate of the at least two power modules, and the second terminal of the at least two power modules to reduce inductance.

7. A power module, comprising:
at least one power substrate;
a plurality of power devices electrically connected to the at least one power substrate;
the at least one power substrate extending in a width direction and a length direction;
a first set of the plurality of power devices arranged in a first row on the at least one power substrate along the width direction;
a second set of the plurality of power devices arranged in a second row on the at least one power substrate along the width direction, the first row being positioned at a different position along the length direction of the at least one power substrate then the second row; and
a plurality of terminals, each of the plurality of terminals extending in the width direction and the length direction of the at least one power substrate, and each of the plurality of terminals being positioned at a different position along the length direction of the at least one power substrate,
wherein at least one portion of a first one of the plurality of terminals is arranged at a higher elevation than at least one portion of a second one of the plurality of terminals.

8. The power module of claim 7, further comprising:
a housing arranged on the at least one power substrate; and
an isolation structure arranged above and configured to be electrically isolated from the at least one power substrate,
wherein one of the plurality of terminals is connected to the isolation structure; and
wherein the isolation structure comprises at least one of the following: an embedded isolation component located in the housing, a secondary power substrate arranged on the at least one power substrate, a film isolation component arranged on the at least one power substrate, and a suspension isolation construction located in the housing.

9. The power module of claim 7, wherein current flows in a loop through the power module through a first one of the plurality of terminals, the at least one power substrate, and a second one of the plurality of terminals to reduce inductance.

10. The power module of claim 7 wherein:
at least one of the plurality of terminals comprise a sheet metal construction;
each of the plurality of terminals extend in the width direction and the length direction of the at least one power substrate; and
each of the plurality of terminals being positioned at a different position along the length direction of the at least one power substrate.

11. A system comprising the power module of claim 7, wherein:
the power module comprises at least two power modules and the at least two power modules are arranged and configured in parallel;
each of the at least two power modules comprises a first terminal of the plurality of terminals;
the first terminals of the at least two power modules being configured to connect to a first buss bar;
the at least two power modules are arranged in a topology pattern; and
the topology pattern forms at least one of the following: a half-bridge configuration, a full-bridge configuration, a common source configuration, a common drain configuration, a neutral point clamp configuration, and a three phase configuration.

12. The system of claim 11, wherein:
each of the at least two power modules comprises a second terminal of the plurality of terminals; and
the second terminals of the at least two power modules being configured to connect to a second buss bar.

13. The system of claim 12, wherein each of the power modules are configured such that current flows in a loop through the first terminal of the at least two power modules, the at least one power substrate of the at least two power modules, and the second terminal of the at least two power modules to reduce inductance.

14. A power module, comprising:
   at least one power substrate;
   a plurality of power devices electrically connected to the at least one power substrate;
   the at least one power substrate extending in a width direction and a length direction;
   a first set of the plurality of power devices arranged in a first row on the at least one power substrate along the width direction;
   a second set of the plurality of power devices arranged in a second row on the at least one power substrate along the width direction, the first row being positioned at a different position along the length direction of the at least one power substrate then the second row; and
   a plurality of terminals, each of the plurality of terminals extending in the width direction and the length direction of the at least one power substrate, and each of the plurality of terminals being positioned at a different position along the length direction of the at least one power substrate,
   wherein current flows in a loop through the power module through a first one of the plurality of terminals, the at least one power substrate, and a second one of the plurality of terminals to reduce inductance.

15. The power module of claim 14, further comprising:
   a housing arranged on the at least one power substrate; and
   an isolation structure arranged above and configured to be electrically isolated from the at least one power substrate,
   wherein one of the plurality of terminals is connected to the isolation structure; and
   wherein the isolation structure comprises at least one of the following: an embedded isolation component located in the housing, a secondary power substrate arranged on the at least one power substrate, a film isolation component arranged on the at least one power substrate, and a suspension isolation construction located in the housing.

16. The power module of claim 14 wherein:
   at least one of the plurality of terminals comprise a sheet metal construction;
   each of the plurality of terminals extending in the width direction and the length direction of the at least one power substrate; and
   each of the plurality of terminals being positioned at a different position along the length direction of the at least one power substrate.

17. A system comprising the power module of claim 14, wherein:
   the power module comprises at least two power modules and the at least two power modules are arranged and configured in parallel;
   each of the at least two power modules comprises a first terminal of the plurality of terminals;
   the first terminals of the at least two power modules being configured to connect to a first buss bar;
   the at least two power modules are arranged in a topology pattern; and
   the topology pattern forms at least one of the following: a half-bridge configuration, a full-bridge configuration, a common source configuration, a common drain configuration, a neutral point clamp configuration, and a three phase configuration.

18. The system of claim 17, wherein:
   each of the at least two power modules comprises a second terminal of the plurality of terminals; and
   the second terminals of the at least two power modules being configured to connect to a second buss bar.

19. The system of claim 18, wherein the power modules are configured such that current flows in a loop through the first terminal of the at least two power modules, the at least one power substrate of the at least two power modules, and the second terminal of the at least two power modules to reduce inductance.

20. A system comprising:
   at least two power modules;
   each of the at least two power modules comprises at least one power substrate;
   each of the at least two power modules comprises a plurality of power devices electrically connected to the at least one power substrate;
   each of the at least two power modules comprises at least two terminals arranged on the at least one power substrate;
   each of the at least two power modules comprises a first terminal of the at least two terminals; and
   the first terminals of the at least two power modules being configured to connect to a first buss bar,
   wherein the at least two power modules are arranged in a topology pattern; and
   wherein the topology pattern forms at least one of the following: a half-bridge configuration, a full-bridge configuration, a common source configuration, a common drain configuration, a neutral point clamp configuration, and a three phase configuration.

21. The system of claim 20, wherein:
   each of the at least two power modules comprises a second terminal of the at least two terminals; and
   the second terminals of the at least two power modules being configured to connect to a second buss bar.

22. The system of claim 21, wherein each of the power modules are configured such that current flows in a loop through the first terminal of the at least two power modules, the at least one power substrate of the at least two power modules, and the second terminal of the at least two power modules to reduce inductance.

23. The system of claim 20, wherein each of the at least two power modules further comprise:
   a first set of the plurality of power devices arranged in a first row on the at least one power substrate along a width direction; and
   a second set of the plurality of power devices arranged in a second row on the at least one power substrate along the width direction, the first row being positioned at a different position along a length direction of the at least one power substrate then the second row,
   wherein the plurality of power devices and the at least two terminals are configured to increase current sharing by the plurality of power devices.

24. The system of claim 20, wherein:
   each of the at least two power modules comprises a housing arranged over the at least one power substrate;
   each of the at least two power modules further comprise an isolation structure arranged above and configured to be electrically isolated from the at least one power substrate;
   one of the at least two terminals is connected to the isolation structure; and
   the isolation structure comprises at least one of the following: an embedded isolation component located in the housing, a secondary power substrate arranged on the at least one power substrate, a film isolation component arranged on the at least one power substrate, and a suspension isolation construction located in the housing.

* * * * *